US012765296B2

(12) United States Patent
Abel et al.

(10) Patent No.: US 12,765,296 B2
(45) Date of Patent: Oct. 13, 2026

(54) METHODS FOR PROTECTING A SURFACE PRIOR TO ETCHING TO OPTIMIZE ETCH PERFORMANCE

(71) Applicant: Tokyo Electron Limited, Tokyo (JP)

(72) Inventors: Kate Abel, Austin, TX (US); Tulashi Dahal, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 186 days.

(21) Appl. No.: 18/944,801

(22) Filed: Nov. 12, 2024

(65) Prior Publication Data

US 2026/0136860 A1 May 14, 2026

(51) Int. Cl.
*H10P 50/66* (2026.01)
*H10P 14/40* (2026.01)
*H10P 95/90* (2026.01)

(52) U.S. Cl.
CPC .......... *H10P 50/667* (2026.01); *H10P 14/412* (2026.01); *H10P 95/90* (2026.01)

(58) Field of Classification Search
None
See application file for complete search history.

(56) References Cited

U.S. PATENT DOCUMENTS 5,374,328 A 12/1994 Remba et al.
6,162,366 A 12/2000 Ishikura et al.
6,616,014 B1 9/2003 Pozniak et al.
6,841,031 B2 1/2005 Iwata et al.
6,896,600 B1 5/2005 Wu et al.
7,683,021 B2 3/2010 Shea et al.
8,597,769 B2 12/2013 Takaya et al.
(Continued)

FOREIGN PATENT DOCUMENTS

KR 1020170022922 3/2017
KR 1020170077839 7/2017
(Continued)

OTHER PUBLICATIONS

Natarajan et al., "Mechanism of Thermal Atomic Layer Etch of W Metal Using Sequential Oxidation And Chlorination: A First-Principles Study", Applied Materials & Interfaces, ACS Appl. Mater. Interfaces, 2020, 11 pgs.
(Continued)

*Primary Examiner* — Binh X Tran
(74) *Attorney, Agent, or Firm* — Egan, Enders & Huston LLP.

(57) ABSTRACT

The present disclosure provides various embodiments of methods for protecting an exposed metal surface of a metal layer prior to etching the metal layer using wet etch chemistry optimized for the bulk metal layer. In the embodiments disclosed herein, the exposed metal surface of the metal layer is protected by depositing a sacrificial metal layer on the exposed metal surface prior to etching the metal layer with the wet etch chemistry. The sacrificial metal layer protects the exposed metal surface by preventing oxidative passivation of the metal surface before and during etching the metal layer with the wet etch chemistry. In some embodiments, the techniques disclosed herein may be used to protect a surface of a ruthenium (Ru) layer prior to etching the ruthenium layer using halogenating etch chemistries in a wet atomic layer etching (ALE) process.

20 Claims, 11 Drawing Sheets

(56) References Cited

U.S. PATENT DOCUMENTS

| | | | |
|---|---|---|---|
| 8,961,814 | B2 | 2/2015 | Van Duren et al. |
| 9,365,770 | B2 | 6/2016 | Okabe et al. |
| 9,768,327 | B2 | 9/2017 | Woehl et al. |
| 10,096,487 | B2 | 10/2018 | Yang et al. |
| 10,157,756 | B2 | 12/2018 | Yamada |
| 10,734,286 | B1 | 8/2020 | Ando et al. |
| 10,982,335 | B2 | 4/2021 | Abel |
| 11,802,342 | B2 | 10/2023 | Abel |
| 2002/0004303 | A1 | 1/2002 | Agnello |
| 2003/0087528 | A1 | 5/2003 | Kruwinus |
| 2006/0289389 | A1 | 12/2006 | Shea |
| 2009/0007938 | A1 | 1/2009 | Dubreuil et al. |
| 2009/0047790 | A1 | 2/2009 | Raghu et al. |
| 2010/0279435 | A1 | 11/2010 | Xu et al. |
| 2011/0094888 | A1 | 4/2011 | Chen et al. |
| 2012/0031768 | A1 | 2/2012 | Reid et al. |
| 2014/0187036 | A1* | 7/2014 | Tanwar ................ H10P 50/667 438/626 |
| 2014/0199840 | A1 | 7/2014 | Bajaj et al. |
| 2014/0370643 | A1 | 12/2014 | Stern et al. |
| 2015/0299848 | A1 | 10/2015 | Haukka et al. |
| 2016/0089686 | A1 | 3/2016 | Lee et al. |
| 2016/0141210 | A1 | 5/2016 | Lei et al. |
| 2016/0372320 | A1 | 12/2016 | Emoto |
| 2017/0053810 | A1 | 2/2017 | Yang et al. |
| 2017/0194196 | A1 | 7/2017 | Brink et al. |
| 2017/0356084 | A1 | 12/2017 | Nakanishi et al. |
| 2018/0090352 | A1 | 3/2018 | Sotoku et al. |
| 2018/0226278 | A1 | 8/2018 | Arnepalli et al. |
| 2018/0374936 | A1 | 12/2018 | Kelly et al. |
| 2019/0011734 | A1 | 1/2019 | Otsuji |
| 2019/0027383 | A1 | 1/2019 | Nakal et al. |
| 2019/0112716 | A1* | 4/2019 | Winter ...................... C23F 1/00 |
| 2019/0148192 | A1 | 5/2019 | Yamaguchi |
| 2019/0198392 | A1 | 6/2019 | Mullick et al. |
| 2019/0295856 | A1 | 9/2019 | Tahara et al. |
| 2020/0111958 | A1* | 4/2020 | Ando ..................... H10N 70/20 |
| 2020/0157693 | A1* | 5/2020 | Abel ....................... C23C 22/02 |
| 2020/0161148 | A1 | 5/2020 | Abel |
| 2020/0286743 | A1 | 9/2020 | Lai et al. |
| 2020/0377792 | A1 | 12/2020 | Guske et al. |
| 2022/0102192 | A1 | 3/2022 | Su et al. |
| 2022/0148885 | A1 | 5/2022 | Abel et al. |
| 2023/0117790 | A1 | 4/2023 | Abel |
| 2023/0118554 | A1* | 4/2023 | Abel ......................... C23F 1/30 |
| 2023/0121246 | A1 | 4/2023 | Abel |
| 2023/0140900 | A1 | 5/2023 | Netzband et al. |
| 2023/0145961 | A1* | 5/2023 | Seo ..................... H10W 20/069 257/758 |
| 2023/0307240 | A1* | 9/2023 | Li .......................... C09K 13/00 |
| 2024/0128092 | A1 | 4/2024 | Nakane et al. |

FOREIGN PATENT DOCUMENTS

| | | |
|---|---|---|
| WO | 2017099718 | 6/2017 |
| WO | 2017205658 | 11/2017 |
| WO | 2018004649 | 1/2018 |

OTHER PUBLICATIONS

Fang et al., "Thermal Atomic Layer Etching: Mechanism, Materials and Prospects", ScienceDirect, National Laboratory of Solid State Microstructures, 2018, 9 pgs.

Xie et al., "Thermal Atomic Layer Etching of Metallic Tungsten via Oxidation and Etch Reaction Mechanism Using O2 or O3 For Oxidation and WCI6 as the Chlorinating Etchant", Journal of Vacuum Science Technology A, Obtained from Internet Feb. 2024, 40 pgs.

Xie et al., "Thermally Driven Self-Limiting Atomic Layer Etching of Metallic Tungsten Using WF6 and 02", Applied Materials & Interfaces, ACS Appl. Mater. Interfaces, 2018, 8 pgs.

Johnson et al., "WO3 and W Thermal Atomic Layer Etching Using "Conversion-Fluorination" and "Oxidation-Conversion-Flurorination" Mechanisms", Applied Materials & Interfaces, American Chemical Society, 2017, 13 pgs.

You et al., "Atomic Layer Etching of Tungsten Dlsulfide Using Remote Plasma-Induced Oxidation and Wet Etching", The Electrochemical Society J Solid State Sci. Technology, 2023, 7 pgs.

Dahal et al., Methods for Wet Atomic Layer Etching of Molybdenum, U.S. Appl. No. 18/240,142, filed Aug. 30, 2023, 72 pgs.

Dahal, "Methods for Wet Atomic Layer Etching of Molybdenum in Aqueous Solution", U.S. Appl. No. 18/636,818, filed Apr. 16, 2024, 62 pgs.

Dahal et al., "Methods For Wet Atomic Layer Etching of Tungsten", U.S. Appl. No. 18/619,491, filed Mar. 28, 2024, 67 pgs.

Dahal et al., "Methods for Wet Atomic Layer Etching of Tungsten Using Halogenation", U.S. Appl. No. 18/900,795, filed Sep. 29, 2024; 57pgs.

International Search Report And The Written Opinion; PCT/US2022/077672; Jan. 27, 2023; 11 pgs.

International Search Report And The Written Opinion; PCT/US2019/061683; Mar. 13, 2020; 9 pgs.

International Search Report And The Written Opinion; PCT/US2019/061678; Mar. 13, 2020, 8 pgs.

"Notification of Transmittal of the International Search Report and the Written Opinion of the International Searching Authority, Or the Declaration", International Application No. PCT/US2025/046705, International Filing Date Sep. 17, 2025, Date of Mailing Jan. 26, 2026, 10 pgs.

* cited by examiner

300

800

METHODS FOR PROTECTING A SURFACE PRIOR TO ETCHING TO OPTIMIZE ETCH PERFORMANCE

This application is related to commonly-assigned U.S. Pat. No. 11,802,342, entitled "METHOD FOR WET ATOMIC LAYER ETCHING OF RUTHENIUM", filed Feb. 17, 2022; commonly-assigned U.S. patent application Ser. No. 18/900,795, entitled "METHODS FOR WET ATOMIC LAYER ETCHING OF TUNGSTEN USING HALOGENATION", filed Sep. 29, 2024; and U.S. patent application Ser. No. 18/914,968, entitled "METHODS FOR CONDITIONING A SURFACE PRIOR TO ETCHING TO OPTIMIZE ETCH PERFORMANCE", filed Oct. 14, 2024; the disclosures of which are expressly incorporated herein, in their entirety, by reference.

BACKGROUND

This disclosure relates to semiconductor device manufacturing, and, in particular, to the removal and etching of polycrystalline materials, such as metals. During routine semiconductor fabrication, various metals formed on a substrate may be removed by patterned etching, chemical-mechanical polishing, as well as other techniques. A variety of techniques are known for etching layers on a substrate, including plasma-based or vapor phase etching (otherwise referred to as dry etching) and liquid based etching (otherwise referred to as wet etching). In dry etching, gas phase etchants react with a surface of a substrate to form species that are volatized to remove material from the substrate surface. Wet etching generally involves dispensing a chemical solution over the surface of a substrate or immersing the substrate in the chemical solution. The chemical solution often contains a solvent and chemical etchant(s) designed to react with materials on the substrate surface and/or promote dissolution of the reaction products within the solvent. The chemical etchant(s) react with the substrate surface to produce soluble species, which are dissolved in the solvent to remove material from the substrate. Etchant composition and temperature may be controlled to control the etch rate, specificity, and residual material on the surface of the substrate post-etch.

A wide variety of materials can be deposited onto a semiconductor substrate and subsequently etched to form various features and structures on and within the semiconductor substrate. For example, metals such as ruthenium (Ru), copper (Cu), cobalt (Co), tungsten (W), molybdenum (Mo), nickel (Ni), platinum (Pt), niobium (Nb), etc., can be deposited onto a semiconductor substrate using various deposition techniques including chemical vapor deposition (CVD), plasma enhanced CVD (PECVD), physical vapor deposition (PVD) and atomic layer deposition (ALD). The metal layers deposited onto the substrate surface can be subsequently etched using a wide variety of wet and dry etching techniques, such as plasma etching, discharge etching, chemical vapor etching (CVE) and atomic layer etching (ALE).

Atomic layer etching (ALE) is a process that removes thin layers of material sequentially through one or more self-limiting reactions. For example, ALE typically refers to techniques that etch with atomic precision, i.e., by removing material one or a few monolayers of material at a time. ALE processes generally rely on a chemical modification of the surface to be etched followed by a selective removal of the modified surface layer. Thus, ALE processes offer improved performance by decoupling the etch process into sequential steps of surface modification and removal of the modified surface. In some embodiments, an ALE process may include multiple cyclic series of layer modification and etch steps, where the modification step modifies the exposed surfaces and the etch step selectively removes the modified layer. In such processes, a series of self-limiting reactions may occur and the cycle may be repeatedly performed until a desired or specified etch amount is achieved. In other embodiments, an ALE process may use just one cycle.

A variety of ALE processes are known, including plasma ALE, thermal ALE and wet ALE techniques. Like all ALE processes, wet ALE is typically a cyclic process that uses sequential, self-limiting reactions to selectively remove material from the surface. Unlike thermal and plasma ALE, however, the reactions used in wet ALE primarily take place in the liquid phase. Compared to other ALE processes, wet ALE is often desirable since it can be conducted at (or near) room temperature and atmospheric pressure. Additionally, the self-limiting nature of the wet ALE process often leads to smoothing of the surface during etching rather than the roughening commonly seen during other etch processes.

A wet ALE process typically begins with a surface modification step, which exposes a material to a first etch solution to create a self-limiting modified surface layer. The modified surface layer may be created through oxidation, reduction, ligand binding, or ligand exchange. Ideally, the modified surface layer is confined to the top monolayer of the material and acts as a passivation layer to prevent the modification reaction from progressing any further. After the modified surface layer is formed, the wet ALE process may expose the modified surface layer to a second etch solution to selectively dissolve the modified surface layer in a subsequent dissolution step. The dissolution step must selectively dissolve the modified surface layer without removing any of the underlying unmodified material. This selectivity can be accomplished by using a different solvent in the dissolution step than was used in the surface modification step, changing the pH, or changing the concentration of other components in the first solvent. The wet ALE cycle can be repeated until a desired or specified etch amount is achieved.

It is well known that material surfaces have unique chemistry compared to the bulk material. In some materials, undercoordinated surface atoms are extremely reactive and may quickly form an inert surface passivation layer upon reacting with the ambient environment. For metals, this surface passivation layer often takes the form of an oxide, a hydroxide, or a hydrate. Unfortunately, surface passivation layers can be challenging to deal with when etching. In some cases, an etch chemistry optimized for the bulk material may struggle to remove the surface passivation layer because it is chemically distinct from the bulk material. In such cases, the surface passivation layer may reduce the etch rate or even prevent etching of the bulk material.

Accordingly, new methods are needed to prevent formation of an inert surface passivation layer on a surface of a material prior to etching the material in order to allow more uniform etching of the material using chemistry optimized for the bulk material.

SUMMARY

The present disclosure provides new methods for protecting a surface of a material to be etched prior to etching the material. More specifically, the present disclosure provides various embodiments of methods for protecting an exposed metal surface of a metal layer prior to etching the metal layer using wet etch chemistry optimized for the bulk metal layer. In the embodiments disclosed herein, the exposed metal surface is protected by depositing a sacrificial metal layer on the exposed metal surface prior to etching the metal layer using the wet etch chemistry. The sacrificial metal layer protects the exposed metal surface by preventing oxidative passivation of on the metal surface before and during etching the metal layer with the wet etch chemistry. In some embodiments, the techniques disclosed herein may be used to protect a surface of a ruthenium (Ru) layer prior to etching the ruthenium layer using halogenating etch chemistries in a wet atomic layer etching (ALE) process.

According to one embodiment, a method is provided herein for protecting a surface of a metal layer to be etched prior to etching the metal layer. The method may generally include: (a) receiving a substrate within a process chamber, (b) depositing the metal layer on the substrate while the substrate is disposed within the process chamber, wherein the metal layer is composed of a first transition metal, and wherein a metal surface of the metal layer is exposed on the surface of the substrate, (c) depositing a sacrificial metal layer on the metal surface of the metal layer, wherein the sacrificial metal layer is composed of a second transition metal that differs from the first transition metal, and (d) etching the sacrificial metal layer and the metal layer in a wet etch process. In some embodiments, the sacrificial metal layer and the metal layer may be etched by: (i) exposing the substrate to a wet etch chemistry to remove the sacrificial metal layer from the metal surface, and (ii) continuing to expose the substrate to the wet etch chemistry after the sacrificial metal layer is removed from the metal surface to etch at least a portion of the metal layer. In the method disclosed above, the sacrificial metal layer deposited on the metal surface in step (c) may increase an etch rate of the metal layer during the wet etch process performed in step (d), compared to an etch rate achieved without the sacrificial metal layer, by preventing oxidative passivation of the metal surface before and during said etching.

The metal layer deposited on the substrate in step (b) may include a wide variety of transition metals. For example, the metal layer may be a ruthenium (Ru) layer, an osmium (Os) layer, a tantalum (Ta) layer, a niobium (Nb) layer, a titanium (Ti) layer, a zirconium (Zr) layer or a hafnium (Hf) layer. In one embodiment, the metal layer may be a ruthenium (Ru) layer having a ruthenium surface exposed on the surface of the substrate.

The sacrificial metal layer deposited on the metal surface in step (c) may be a relatively thin transition metal layer (e.g., approximately 1 nm-5 nm thick), which differs from the bulk metal layer, but is soluble within the wet etch chemistry used to etch the bulk metal layer. For example, when the metal layer etched in step (d) is a ruthenium (Ru) layer, the sacrificial metal layer may be a copper (Cu) layer, a molybdenum (Mo) layer, a tungsten (W) layer, a nickel (Ni) layer, a cobalt (Co) layer, a platinum (Pt) layer, a gold (Au) layer, or an iridium (Ir) layer. In some embodiments, the sacrificial metal layer may be deposited on the metal surface in step (c) while the substrate is disposed within the process chamber, and without exposing the substrate to air or other oxidizing environments, to avoid forming an oxidative passivation layer on the metal surface before said etching.

In other embodiments, the method may further include annealing the substrate in a reducing atmosphere to reduce the metal surface before depositing the sacrificial metal layer on the metal surface in step (c). The substrate may be annealed by exposing the substrate to a gaseous reducing agent and a temperature ranging between 100° C. and 500° C. to at least partially reduce the metal surface. A wide variety of gaseous reducing agents may be used to reduce the metal surface. For example, the gaseous reducing agent may be hydrogen ($H_2$), hydrazine ($N_2H_4$), carbon monoxide (CO), ammonia ($NH_3$), methane ($CH_4$), formic acid ($CH_2O_2$) or another volatile carboxylic acid. In one example embodiment, the metal layer may be a ruthenium (Ru) layer having a ruthenium surface exposed on the surface of the substrate, and the substrate may be annealed by exposing the substrate to a hydrogen ($H_2$) gas and a temperature ranging between 150° C. and 250° C. to at least partially desorb any oxide, hydroxide or hydrate groups bound to the ruthenium surface.

A wide variety of wet etch processes can be used to etch the sacrificial metal layer and the metal layer in step (d). In some embodiments, the sacrificial metal layer and the metal layer may be etched by performing multiple cycles of a wet ALE process (or another wet etch process) that uses a halogen-based wet etch chemistry to chemically modify exposed surfaces of the metal layers and form self-limiting passivation layers, which are insoluble in the halogen-based wet etch chemistry, but readily soluble in another solution used to selectively remove the passivation layers. The halogen-based wet etch chemistry may generally include an electrophilic halogenation agent dissolved in a non-aqueous solvent. For example, the electrophilic halogenation agent may be an electrophilic chlorinating agent, an electrophilic fluorinating agent or an electrophilic brominating agent, and the non-aqueous solvent may be an ether, a ketone, a halocarbon, a heterocyclic, an alcohol or another polar organic solvent.

In some embodiments, the metal layer being etched in step (d) may be a ruthenium (Ru) layer having a ruthenium surface exposed on the surface of the substrate. In such embodiments, the sacrificial metal layer deposited on the ruthenium surface in step (c) may protect the ruthenium surface by preventing formation of at least one of the following: (i) an oxidative passivation layer on the ruthenium surface prior to etching the ruthenium layer with the halogen-based wet etch chemistry, and (ii) ruthenium dioxide ($RuO_2$) and/or other ruthenium species having oxidation states higher than 3+ on the ruthenium surface while etching the ruthenium layer with the halogen-based wet etch chemistry.

According to another embodiment, a method is provided herein for conditioning a surface of a ruthenium (Ru) layer to be etched prior to etching the ruthenium layer in a wet atomic layer etching (ALE) process. The method may generally include: (a) depositing the ruthenium layer on a substrate, wherein a ruthenium surface of the ruthenium layer is exposed on a surface of the substrate; (b) depositing a sacrificial metal layer on the ruthenium surface, wherein the sacrificial metal layer comprises a transition metal that differs from the ruthenium layer; (c) performing the wet ALE process to remove the sacrificial metal layer from the ruthenium surface; and (d) continuing the wet ALE process to etch the ruthenium layer once the sacrificial metal layer is removed from the ruthenium surface.

In the method disclosed above, the wet ALE process exposes the substrate to a halogen-based wet etch chemistry that removes the sacrificial metal layer from the ruthenium surface and etches at least a portion of the ruthenium layer. The sacrificial metal layer deposited on the ruthenium surface in step (b) increases an etch rate of the ruthenium layer during the wet ALE process, compared to an etch rate achieved without the sacrificial metal layer, by preventing formation of at least one of the following: (i) an oxidative passivation layer on the ruthenium surface prior to etching the ruthenium layer with the halogen-based wet etch chemistry, and (ii) ruthenium dioxide ($RuO_2$) and/or other ruthenium species having oxidation states higher than 3+ on the ruthenium surface when the substrate is exposed to the halogen-based wet etch chemistry.

The sacrificial metal layer deposited in step (b) may be a relatively thin transition metal layer (e.g., approximately 1-5 nm thick), which differs from the bulk ruthenium layer, but is soluble within the halogen-based wet etch chemistry used to etch the bulk ruthenium layer. For example, the sacrificial metal layer may be a copper (Cu) layer, a molybdenum (Mo) layer, a tungsten (W) layer, a nickel (Ni) layer, a cobalt (Co) layer, a platinum (Pt) layer, a gold (Au) layer, or an iridium (Ir) layer, as noted above. In some embodiments, the sacrificial metal layer may be deposited in step (b) after the ruthenium layer is deposited on the substrate in step (a) without exposing the substrate to air or other oxidizing environments to avoid forming an oxidative passivation layer on the ruthenium surface before performing the wet ALE process. In other embodiments, the method may anneal the substrate in a reducing atmosphere to at least partially reduce the metal surface before depositing the sacrificial metal layer on the ruthenium surface in step (b).

After the sacrificial metal layer is deposited on the ruthenium surface in step (b), the method may perform the wet ALE process to first remove the sacrificial metal layer in step (c) before seamlessly continuing the wet ALE process to etch at least a portion of the ruthenium layer in step (d).

In some embodiments, the wet ALE process performed in step (c) to remove the sacrificial metal layer may include: (i) exposing a transition metal surface of the sacrificial metal layer to a first etch solution comprising an electrophilic halogenation agent dissolved in a non-aqueous solvent to form a transition metal halide or oxyhalide passivation layer, which is self-limiting and insoluble in the non-aqueous solvent; (ii) rinsing the substrate with a first purge solution to remove the first etch solution from the surface of the substrate; (iii) exposing the transition metal halide or oxyhalide passivation layer to a second etch solution to selectively remove the transition metal halide or oxyhalide passivation layer and expose an unmodified transition metal surface underlying the transition metal halide or oxyhalide passivation layer; (iv) rinsing the substrate with a second purge solution to remove the second etch solution from the surface of the substrate and etch the sacrificial metal layer; and (v) repeating said exposing the transition metal surface of the sacrificial metal layer to the first etch solution, rinsing the substrate with the first purge solution, exposing the transition metal halide or oxyhalide passivation layer to the second etch solution, and rinsing the substrate with the second purge solution until the sacrificial metal layer is removed from the ruthenium surface.

In some embodiments, the wet ALE process may continue in step (d) to etch at least a portion of the ruthenium layer by: (i) exposing the ruthenium surface to the first etch solution comprising the electrophilic halogenation agent dissolved in the non-aqueous solvent to form a ruthenium halide or oxyhalide passivation layer, which is self-limiting and insoluble in the non-aqueous solvent; (ii) rinsing the substrate with the first purge solution to remove the first etch solution from the surface of the substrate; (iii) exposing the ruthenium halide or oxyhalide passivation layer to the second etch solution to selectively remove the ruthenium halide or oxyhalide passivation layer and expose an unmodified ruthenium surface underlying the ruthenium halide or oxyhalide passivation layer; (iv) rinsing the substrate with the second purge solution to remove the second etch solution from the surface of the substrate and etch the ruthenium layer; and (v) repeating said exposing the ruthenium surface to the first etch solution, rinsing the substrate with the first purge solution, exposing the ruthenium halide or oxyhalide passivation layer to the second etch solution, and rinsing the substrate with the second purge solution a number of times until a predetermined amount of the ruthenium layer is removed from the substrate.

A wide variety of etch chemistries can be used in the first etch solution and the second etch solution to etch ruthenium in the method disclosed above. For example, the first etch solution may include an electrophilic chlorinating agent, an electrophilic fluorinating agent or an electrophilic brominating agent dissolved in a non-aqueous solvent, and the second etch solution may be an aqueous dissolution solution containing a ligand and a base. In one example embodiment, the first etch solution may include trichloroisocyanuric acid (TCCA) dissolved in a polar organic solvent (such as, e.g., ethyl acetate, acetone, acetonitrile or a chlorocarbon), where a concentration of the TCCA in the first etch solution ranges between 0.2% and 35%. Other examples of etch chemistries that can be used in the first etch solution and the second etch solution to etch the sacrificial metal layer and the ruthenium layer are disclosed further herein. Although etch chemistries are disclosed herein for etching ruthenium in a wet ALE process, one skilled in the art would recognize how the techniques disclosed herein could be used to protect a surface of other metal layers prior to etching such layers using potentially other wet etch chemistries and/or processes.

As noted above and described further herein, the present disclosure provides various embodiments of methods for protecting a surface of a metal layer to be etched prior to etching the metal layer. Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
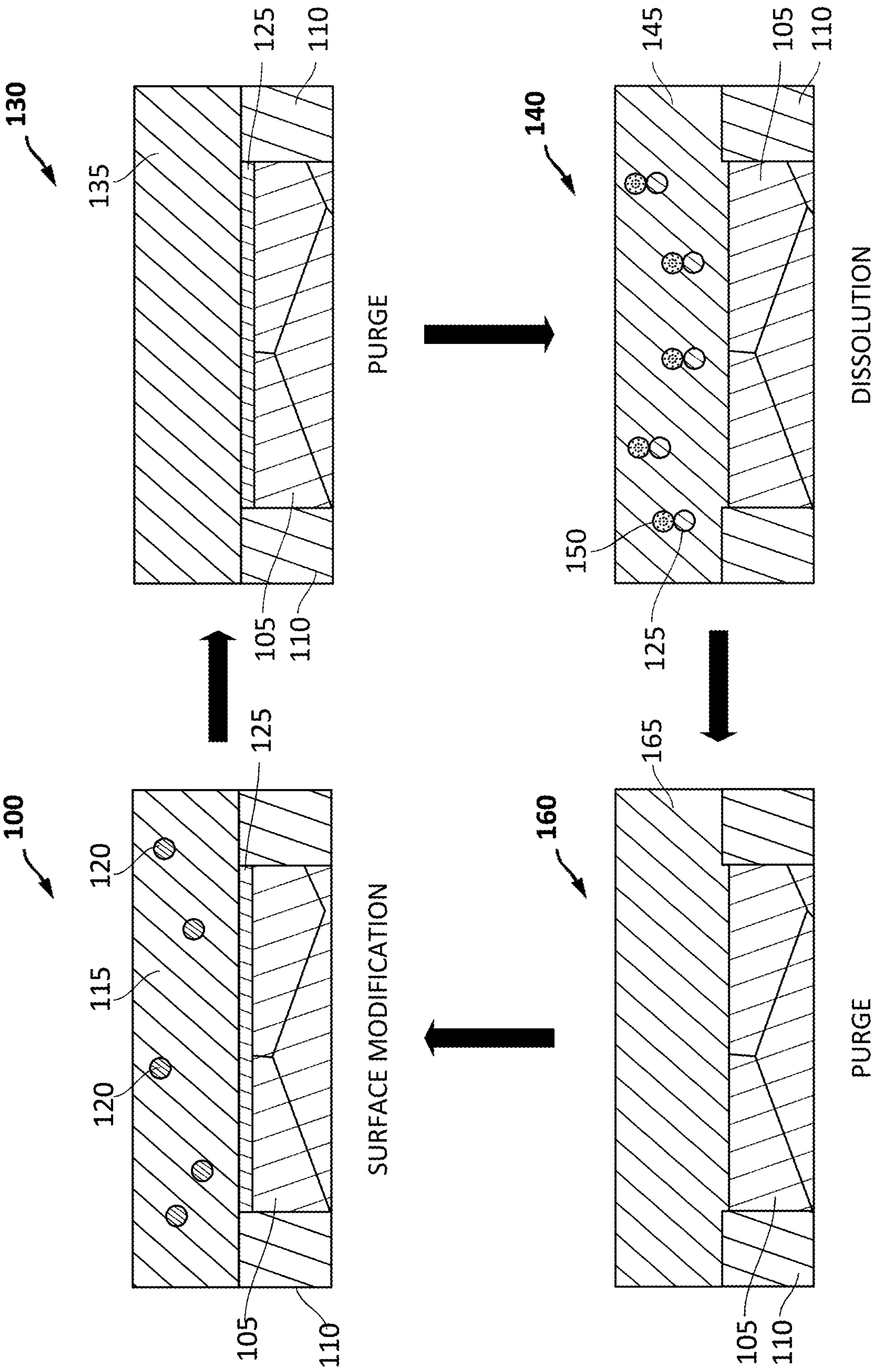
FIG. 1 illustrates one example of a wet atomic layer etching (ALE) process that can be used to etch a metal layer in accordance with the present disclosure.

The present disclosure provides new methods for protecting a surface of a material to be etched prior to etching the material. More specifically, the present disclosure provides various embodiments of methods for protecting an exposed metal surface of a metal layer prior to etching the metal layer using wet etch chemistry optimized for the bulk metal layer. In the embodiments disclosed herein, the exposed metal surface is protected by depositing a sacrificial metal layer on the exposed metal surface prior to etching the metal layer with the wet etch chemistry. The sacrificial metal layer protects the exposed metal surface by preventing oxidative passivation of the metal surface before and during etching the metal layer with the wet etch chemistry. In some embodiments, the techniques disclosed herein may be used to protect a surface of a ruthenium (Ru) layer prior to etching the ruthenium layer using halogenating etch chemistries in a wet atomic layer etching (ALE) process.

The techniques described herein may be generally used to etch ruthenium, which is a noble metal that is usually polycrystalline as deposited. Although many chemicals can be used to etch ruthenium, the polycrystalline nature of ruthenium makes it susceptible to pitting if an etchant preferentially attacks the grain boundaries. Etchant chemistry should, at a minimum, leave the surface no rougher than it was initially and ideally improve the surface roughness during etching. Acceptable surface morphology can be accomplished through the formation of a self-limiting passivation layer that is selectively removed in a cyclic wet ALE process.

Conventional methods for etching ruthenium often use oxidizing agents (or oxidizers) to form a ruthenium metal-oxide passivation layer on the ruthenium surface. For example, a chemical solution containing dissolved oxygen or another oxidizing agent can be used to oxidize a ruthenium surface and form a ruthenium dioxide ($RuO_2$) surface layer, which is insoluble in the chemical solution. Alternatively, strong oxidizers (such as sodium hypochlorite, ceric ammonium nitrate or periodic acid) can oxidize a ruthenium surface to create a soluble ruthenium tetroxide ($RuO_4$) surface layer on exposed surfaces of the ruthenium. Unfortunately, the oxidizers used in these methods either form: (a) an insoluble $RuO_2$ surface layer, which is difficult to deal with in the etch process, or (b) a soluble $RuO_4$ surface layer, which is extremely volatile and soluble, leading to insufficient surface passivation during the etch and post-etch surface roughness. The oxidizers typically used to form $RuO_4$ surface layers are also expensive and/or pose a metal contamination risk.

New etch chemistries for etching ruthenium (as well as other transition and noble metal surfaces) in a wet ALE process are disclosed in commonly assigned U.S. Pat. No. 11,802,342, entitled "METHOD FOR WET ATOMIC LAYER ETCHING OF RUTHENIUM", the disclosure of which is incorporated herein by reference. The etch chemistry disclosed in the '342 Patent differs from traditional ruthenium wet etch chemistries in that it primarily uses halogenation, rather than oxidation, to form an insoluble ruthenium species on the ruthenium surface. In the '342 Patent, the ruthenium surface is exposed to a halogenation agent during the surface modification step to form a ruthenium halide, a ruthenium oxyhalide or a ruthenium salt passivation layer on the ruthenium surface. The ruthenium halide, ruthenium oxyhalide or ruthenium salt passivation layer is insoluble in the surface modification solution, but freely soluble in the dissolution solution used to selectively remove the modified surface layer during each cycle of the wet ALE process.

FIG. 1 illustrates one example of a wet ALE process in accordance with the present disclosure and the techniques previously disclosed in the '342 Patent. More specifically, FIG. 1 illustrates exemplary steps performed during one cycle of a wet ALE process used to etch a polycrystalline material 105. In one embodiment, the polycrystalline material 105 to be etched may be ruthenium (Ru). However, the wet ALE process shown in FIG. 1 and the methods disclosed further herein are not limited to etching ruthenium, and may also be used to etch other transition and noble metals, such as but not limited to, osmium (Os), tantalum (Ta), niobium (Nb), titanium (Ti), zirconium (Zr) and hafnium (Hf).

In the process shown in FIG. 1, a polycrystalline material 105 surrounded by a dielectric material 110 is brought in contact with a surface modification solution 115 during a surface modification step 100 to modify exposed surfaces of the polycrystalline material 105. In some embodiments, the surface modification solution 115 may contain an electrophilic halogenation agent 120 dissolved in a first solvent. For example, the surface modification solution 115 may include an electrophilic chlorinating agent, an electrophilic fluorinating agent or an electrophilic brominating agent dissolved in a non-aqueous solvent (e.g., an ether, a ketone, a halocarbon, a heterocyclic, an alcohol or another polar organic solvent). In other embodiments, the surface modification solution 115 may include an oxidizing agent and a chloride salt in concentrated hydrochloric acid (HCl).

When exposed to the surface modification solution 115, a chemical reaction occurs between the electrophilic halogenation agent 120 and the exposed surface of the polycrystalline material 105 to form a modified surface layer 125 (e.g., a ruthenium halide, a ruthenium oxyhalide or a ruthenium salt modified surface layer) in the surface modification step 100. In some cases, the chemical reaction to form the modified surface layer 125 may be fast and self-limiting. In other words, the reaction product may modify one or more monolayers of the exposed surface of the polycrystalline material 105, but may prevent any further reaction between the surface modification solution 115 and the underlying surface. By necessity, neither the polycrystalline material 105 to be etched nor the modified surface layer 125 can be soluble in the surface modification solution 115. In some cases, the surface modification step 100 shown in FIG. 1 may continue until the surface reaction is driven to saturation.

After the modified surface layer 125 is formed, the substrate may be rinsed with a first purge solution 135 to remove excess reactants from the surface of the substrate in a first purge step 130. The first purge solution 135 should not react with the modified surface layer 125 or with the reagents present in the surface modification solution 115. In some embodiments, the first purge solution 135 used in the first purge step 130 may use the same solvent (e.g., the first solvent) previously used in the surface modification step 100. In other embodiments, a different solvent may be used in the first purge solution 135. In some embodiments, the first purge step 130 may be long enough to completely remove all excess reactants from the substrate surface.

Once rinsed, a dissolution step 140 is performed to selectively remove the modified surface layer 125. In the dissolution step 140, the modified surface layer 125 is exposed to a dissolution solution 145 to selectively remove or dissolve the modified surface layer 125 without removing the unmodified polycrystalline material 105 underlying the modified surface layer 125. The modified surface layer 125 must be soluble in the dissolution solution 145, while the unmodified polycrystalline material 105 underlying the modified surface layer 125 must be insoluble. The solubility of the modified surface layer 125 allows its removal through dissolution into the bulk dissolution solution 145. In some embodiments, the dissolution step 140 may continue until the modified surface layer 125 is completely dissolved.

A variety of different dissolution solutions 145 may be used in the dissolution step, depending on the surface modification solution 115 used during the surface modification step 100 and/or the modified surface layer 125 formed. In some embodiments, for example, the dissolution solution 145 may be an aqueous solution containing a ligand 150, which assists in the dissolution process. For example, the ligand 150 may react or bind with the modified surface layer 125 to form a soluble species that dissolves within the dissolution solution 145. In other embodiments, the dissolution solution 145 may be a second solvent, which is different from the first solvent used in the surface modification solution 115. In other embodiments, the dissolution solution 145 may contain alkali metal ions in a basic solution. In such embodiments, ion exchange may be used to improve the solubility of the modified surface layer 125 in aqueous solution.

Once the modified surface layer 125 is dissolved, the ALE etch cycle shown in FIG. 1 may be completed by performing a second purge step 160. The second purge step 160 may be performed by rinsing the surface of the substrate with a second purge solution 165, which may be the same or different than the first purge solution 135. In some embodiments, second purge solution 165 may use the same solvent, which was used in the dissolution solution 145. The second purge step 160 may generally continue until the dissolution solution 145 and/or the reactants contained with the dissolution solution 145 are completely removed from the surface of the substrate.

Wet ALE of ruthenium requires the formation of a self-limiting passivation layer on the ruthenium surface. The formation of this passivation layer is accomplished by exposure of the ruthenium surface to a first etch solution (i.e., surface modification solution 115) that enables or causes a chemical reaction between the species in solution and the ruthenium surface. This passivation layer must be insoluble in the solution used for its formation, but freely soluble in the second etch solution (i.e., dissolution solution 145) used for its dissolution.

A wide variety of etch chemistries may be used in the surface modification solution 115 and the dissolution solution 145 when etching transition and noble metals, such as ruthenium (Ru), using the wet ALE process shown in FIG. 1. Example etch chemistries for etching ruthenium are discussed in more detail below. Mixing of these solutions leads to a continuous etch process, loss of control of the etch and roughening of the post-etch surface, all of which undermines the benefits of wet ALE. Thus, purge steps 130 and 160 are performed in the wet ALE process shown in FIG. 1 to prevent direct contact between the surface modification solution 115 and the dissolution solution 145 on the substrate surface.

According to one embodiment, a ruthenium surface may be exposed to a surface modification solution 115 containing an electrophilic chlorinating agent dissolved in a non-aqueous solvent. The electrophilic chlorinating agent chemically modifies the ruthenium surface to form a ruthenium chloride or oxychloride passivation layer, which is self-limiting and insoluble in the non-aqueous solvent. In one example embodiment, a ruthenium trichloride ($RuCl_3$) passivation layer is formed when the ruthenium surface is exposed to a surface modification solution 115 containing trichloroisocyanuric acid (TCCA) dissolved in various polar organic solvents, such as ethyl acetate (EA), acetone, acetonitrile or a chlorocarbon. To form a ruthenium trichloride (RuCl passivation layer on the ruthenium surface, the concentration of TCCA within the surface modification solution 115 may range, for example, between 0.2% and 35%.

In the example embodiment described above, TCCA acts as both the oxidizer and the chlorine source in the surface modification reaction. Although TCCA oxidizes the ruthenium surface in the chemical sense to form a ruthenium trichloride ($RuCl_3$) passivation layer on the ruthenium surface, no metal-oxide is being formed in the reaction. This differs from conventional ruthenium etch chemistries, which utilize oxidizing agents (or oxidizers) to form a ruthenium metal-oxide (e.g., a $RuO_2$ or $RuO_4$) passivation layer.

Although TCCA is used as the reactant for the chlorination of the ruthenium surface in the etch chemistry described above, other electrophilic chlorinating agents can also be used to oxidate and chlorinate the ruthenium surface. Other examples of electrophilic chlorinating agents include, but are not strictly limited to, N-chlorosuccinimide, 1-chlorobenzotriazole, Chloramine-T and tert-butyl-N-chlorocyanamide. This is not an exhaustive list of all possible chlorinating agents that can be used in the surface modification step 100. Additionally, other ruthenium halides can also be formed on the ruthenium surface and used as a self-limiting passivation layer. For example, ruthenium fluorides and ruthenium bromides can be used, in addition to ruthenium chlorides. These ruthenium halides can be formed using various electrophilic fluorinating agents and electrophilic brominating agents. Examples of electrophilic fluorinating agents include, but are not limited to, 1-chloromethyl-4-fluoro-1,4-diazoniabicyclo[2.2.2]octane bis(tetrafluoroborate), 1-fluoropyridinium triflate, 1-fluoro-2,4,6-trimethylpyridinium tetrafluoroborate, N-fluorobenzenesulfonimide, fluoroxytrifluoromethane, perchloryl fluoride, xenon difluoride and N-fluorobis[(trifluoromethyl)sulfonyl]imide. Examples of electrophilic brominating agents include, but are not limited to, N-bromosuccinimide, dibromoisocyanuric acid, tribromocyanuric acid, 1,3-Dibromo-5,5-Dimethylhydantoin and N-Bromoacetamide.

The self-limiting passivation layer formed during the surface modification step 100 must be removed every cycle after its formation. A second solution is used in the dissolution step 140 to selectively dissolve this modified layer. When TCCA dissolved in EA is used in the surface modification solution 115 to form a ruthenium chloride (e.g., $RuCl_3$) passivation layer on the ruthenium surface, reactive dissolution can be used in the dissolution step 140 to effectively remove the ruthenium chloride passivation layer. In reactive dissolution, ligands dissolved in a second solvent react with the surface to form a soluble species that dissolves within the dissolution solution 145. Many different ligand species can be used for reactive dissolution of the $RuCl_3$ passivation layer. In one embodiment, ethylenediaminetetraacetic acid (EDTA) may be used as the ligand species for reactive dissolution. EDTA reacts with $RuCl_3$ to form a Ru-EDTA complex that is soluble in aqueous solution. This reaction is base catalyzed, so the dissolution solution 145 must contain EDTA and a strong base. Mixing of the TCCA-containing surface modification solution 115 and the EDTA-containing dissolution solution 145 leads to a continuous etch process, loss of control of the etch, and roughening of the surface. Therefore, solvent rinse steps (i.e., purges steps 130 and 160) are necessary to prevent direct contact between the two etch solutions on the ruthenium surface.

In the etch chemistry described above, the dissolution solution 145 is an aqueous solution of EDTA as the ligand 150 and tetramethylammonium hydroxide (TMAH, $(CH_3)_4NOH$) as the base. Alternative ligands for dissolution include, but are not limited to, iminodiacetic acid (IDA), diethylenetriaminepentaacetic acid (DTPA), acetylacetone (ACAC) and ascorbic acid (AA). EDTA, IDA, DTPA and AA can be used in aqueous solution, while ACAC can be used in aqueous solution, ethanol, dimethyl sulfoxide (DMSO) or other organic solvents. Any strong base can be used in the dissolution solution 145. For example, bases such as potassium hydroxide (KOH), sodium hydroxide (NaOH), ammonium hydroxide ($NH_4OH$), tetramethylammonium hydroxide (TMAH, $(CH_3)_4NOH$), or any other strong base can be used in the dissolution solution 145 as it is just needed to deprotonate the ligand 150 to allow binding with the ruthenium surface.

The wet ALE process described above relies on both the surface modification and dissolution reactions being self-limiting. Self-limiting means that only a limited thickness of the ruthenium at the surface is modified or removed, regardless of how long a given etch solution is in contact with the ruthenium surface.

While ruthenium chloride ($RuCl_3$) and other ruthenium halides and oxyhalides provide a well-behaved, self-limiting modified surface layer for ruthenium wet ALE, they are not the only option available for creating a self-limiting passivation layer on the ruthenium surface. An alternative chemistry for ruthenium wet ALE may be used to form a self-limiting ruthenate salt or a perruthenate salt passivation layer. In some embodiments, a ruthenate salt or a perruthenate salt may be formed during the surface modification step 100 by exposing the ruthenium surface to an oxidizing solution containing an oxidizer, an appropriate cation and a chlorine source that is reactive to ruthenium, such as concentrated hydrochloric acid (HCl). For example, the Ru surface may exposed to an aqueous surface modification solution containing ammonium persulfate (APS) or tetrabutylammonium peroxymonosulfate (TBAPMS) as an oxidizer in concentrated HCl solution. Additionally, a salt such as tetramethyl ammonium chloride (TMAC) or 1-butyl-3-methylimidizolium chloride may be present in aqueous solution to provide the cations needed for the ruthenium salt formation. The oxidation of ruthenium in an HCl solution leads to the formation of a ruthenium salt passivation layer containing $RuO_xCl_y^{z-}$ polyanions. The HCl acts as a mild reducing agent and limits the final oxidation state of the ruthenium. Thus, the ruthenium species formed on the surface can be controlled by the concentration of HCl in the oxidizing solution. Additionally, the solubility of the ruthenium salt can be controlled by the counter-ion coordinating with the ruthenium polyanion in the salt. Thus, the solubility of the ruthenium salt passivation layer can be controlled by the HCl concentration, as well as the cations present in the oxidizing solution. In one example experiment, a stable passivation layer was formed with a solution having a HCl concentration of 6M and TMAC as the salt species.

After the insoluble ruthenium salt passivation layer is formed on the ruthenium surface, it can be removed via solvent exchange or ion exchange in a subsequently performed dissolution step 140. In the solvent exchange dissolution method, the insoluble ruthenium salt passivation layer is dissolved in a pure solvent (such as, e.g., trichlorobenzene) to remove the passivation layer from the ruthenium surface. In the ion exchange dissolution method, the insoluble ruthenium salt passivation layer is removed using ion exchange to improve the solubility of the ruthenium salt passivation layer in the aqueous solution used to form the passivation layer. For example, the ruthenium salt passivation layer can be removed from the ruthenium surface by exchanging $Me_4N+$ cations with K+ cations. This ion exchange improves the solubility of the ruthenium salt passivation layer, so that it can be dissolved within the aqueous surface modification solution.

The new etch chemistries used in the '342 Patent for etching ruthenium in a wet ALE process either: (a) primarily use halogenation to form an insoluble ruthenium halide or oxyhalide passivation layer, which is selectively removed via ligand-assisted dissolution, or (b) use oxidation in a concentrated HCl solution containing a chloride salt to form an insoluble ruthenium salt passivation layer, which is selectively removed by solvent or ion exchange. Unlike conventional etch chemistries for etching ruthenium, the etch chemistries described herein avoid forming a ruthenium metal-oxide (e.g., a $RuO_2$ or $RuO_4$) passivation layer on the ruthenium surface during the surface modification step 100. The etch chemistries disclosed above are also metal-free, cost-effective and improve surface roughness during etching.

Figure 2A:
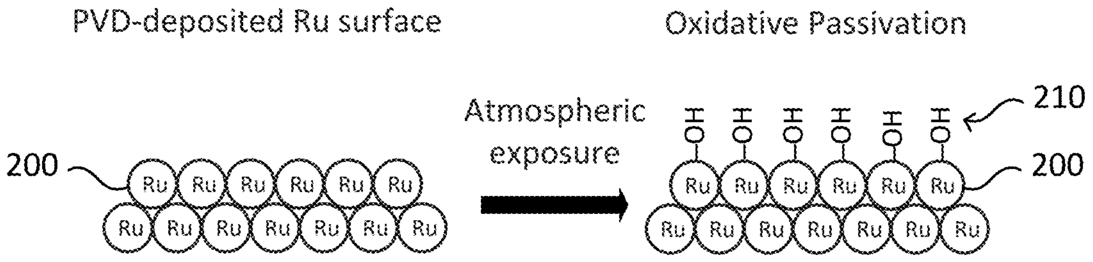
FIG. 2A is a schematic diagram of a ruthenium (Ru) layer deposited via physical vapor deposition (PVD) and the oxidative changes that occur on the ruthenium surface upon atmospheric exposure.
Figure 2B:
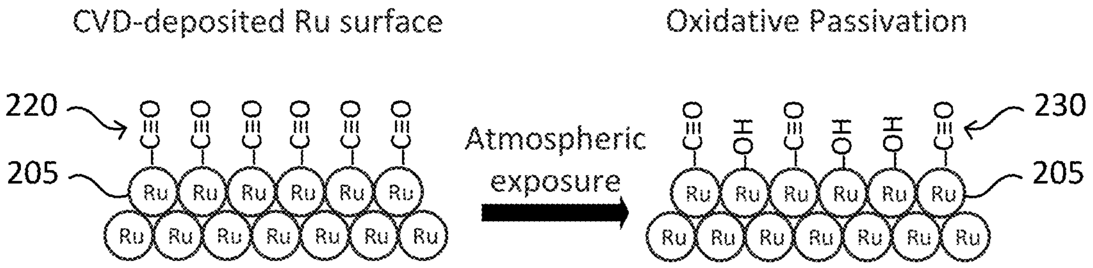
FIG. 2B is a schematic diagram of a ruthenium (Ru) layer deposited via chemical vapor deposition (CVD) and the oxidative changes that occur on the ruthenium surface over time with atmospheric exposure.

While the etch chemistries disclosed in the '342 Patent provide numerous advantages over traditional ruthenium wet etch chemistries, they are sensitive to the surface chemistry on the ruthenium surface. The surface chemistry depends, not only on the deposition methods and chemistries used to form a ruthenium layer on a substrate, but also on the post-deposition conditions (e.g., exposure to air) and processing steps performed on the substrate after deposition of the ruthenium layer (e.g., a post-deposition anneal, chemical oxidation process, or etch process used to etch the ruthenium layer). For example, FIG. 2A demonstrates how a ruthenium layer deposited via PVD may initially leave the ruthenium surface 200 un-passivated. When the substrate is removed from the deposition chamber, air exposure oxidatively passivates the ruthenium surface 200, forming an oxidative passivation layer 210 comprising an oxide, hydroxide or hydrate group on the ruthenium surface 200. Alternatively, FIG. 2B shows CVD deposition of ruthenium layers using a ruthenium carbonyl precursor leaves a carbonyl passivation layer 220 comprising carbonyl groups (e.g., CO ligands) on the ruthenium surface 205. Over time and atmospheric exposure, the carbonyl groups may be slowly displaced and re-passivated with an oxide, hydroxyl, or hydrate group, forming a mixed-valence passivation layer 230 on the ruthenium surface 205, as shown for example in FIG. 2B.

Etch experiments performed on CVD and PVD-deposited ruthenium layers show that ruthenium layers deposited by CVD etch much faster than those deposited by PVD when the etch is performed immediately after deposition. This is likely due to the carbonyl groups formed on the ruthenium surface 205 of the CVD-deposited ruthenium layers being easier to etch than the oxide, hydroxide or hydrate groups formed on the ruthenium surface 200 of the PVD-deposited ruthenium layers. However, the etch rate of the CVD-deposited ruthenium was also found to decrease over time under atmospheric conditions, indicating that oxidative degradation plays a role in hindering the etch.

Figure 3:
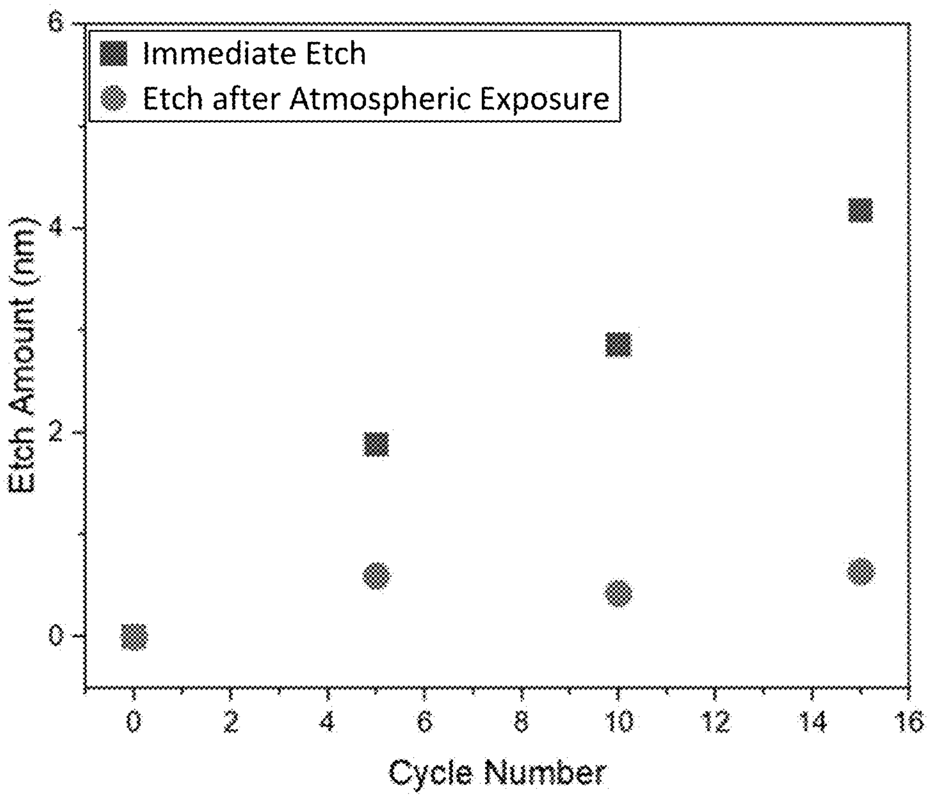
FIG. 3 is a graph illustrating exemplary etch rates (expressed in nm/cycle) achieved for a CVD-deposited ruthenium layer etched immediately after deposition and after long term atmospheric exposure.

The graph 300 shown in FIG. 3 depicts exemplary etch rates (expressed in nm/cycle) achieved for a CVD-deposited ruthenium layer etched immediately after deposition and after long-term atmospheric exposure (e.g., after approximately ~9 months of storage). As shown in the graph 300, the etch rate of the same CVD-deposited ruthenium layer decreased from 0.29 nm/cycle to 0.04 nm/cycle after long-term atmospheric exposure. The etch conditions were identical for both tests. The change in etch behavior for the CVD-deposited ruthenium layer over time is attributed to oxidative degradation of the carbonyl passivation layer 220 initially formed on the ruthenium surface 205. As noted above, the carbonyl groups bound to the ruthenium surface 205 are displaced over time, and the ruthenium surface 205 is quickly re-passivated with an oxide, hydroxyl, or hydrate group, forming a mixed-valence passivation layer 230. This is an irreversible process under atmospheric conditions.

The etch experiments performed on CVD and PVD-deposited ruthenium layers indicated that oxidative passivation of the ruthenium surface is responsible for the loss of etch activity. Surfaces are inherently more reactive than bulk materials due to the undercoordination of surface atoms. This leads to surface passivation chemistry that would otherwise not occur in bulk materials. Ruthenium is considered a noble metal and does not easily oxidize under atmospheric conditions. However, passivation of the dangling surface bonds on the ruthenium surface can lead to monolayer oxide, hydroxide, or hydrate formation on the ruthenium surface, which hinders the etch. Thus, new methods are needed to protect the ruthenium surface by preventing oxidative passivation of the ruthenium surface.

New methods are provided herein to protect a surface of a metal layer, prior to etching the metal layer, to optimize etching of the metal layer during a wet etch process. In the methods disclosed herein, a surface of a metal layer is protected by forming a sacrificial metal layer on the metal surface prior to etching the metal layer with a wet etch chemistry optimized for the bulk metal layer. In some embodiments, the sacrificial metal layer may increase the etch rate of the metal layer by: (a) preventing oxidative passivation/degradation of the metal surface that often occurs with atmospheric exposure (either immediately or over time) or other processing steps performed prior to etching, and/or (b) preventing oxidative passivation of the metal surface when the metal surface is exposed to the wet etch chemistry during the wet etch process.

The sacrificial metal layer disclosed herein may be used to optimize etching of a wide variety of metal layers deposited using various deposition techniques (e.g., CVD, PVD, ALD, etc.). For example, the sacrificial metal layer may be used to optimize etching of transition metals such as, but not limited to, ruthenium (Ru), osmium (Os), tantalum (Ta), niobium (Nb), titanium (Ti), zirconium (Zr) and hafnium (Hf). In some embodiments, a sacrificial metal layer may be deposited on a surface of a ruthenium (Ru) layer deposited via CVD or PVD to protect the ruthenium surface prior to etching the ruthenium layer with a wet etch chemistry optimized for the bulk ruthenium layer. The sacrificial metal layer may protect the ruthenium surface by preventing oxidative passivation of the ruthenium surface before and during etching of the ruthenium layer. In doing so, the sacrificial metal layer may increase the etch rate and optimize the ruthenium wet etch process.

The sacrificial metal layer chosen to protect the metal layer may be a relatively thin transition metal layer (e.g., approximately 1-5 nm thick), which differs from the bulk metal layer, but is soluble within the wet etch chemistry used to etch the bulk metal layer. For example, when the metal layer being etched is a ruthenium (Ru) layer, the sacrificial metal layer may be a copper (Cu) layer, a molybdenum (Mo) layer, a tungsten (W) layer, a nickel (Ni) layer, a cobalt (Co) layer, a platinum (Pt) layer, a gold (Au) layer, or an iridium (Ir) layer. In some embodiments, the wet etch chemistry used to etch the bulk metal layer may etch the sacrificial metal layer at a faster etch rate than the etch rate of the bulk metal layer. In one embodiment, the sacrificial metal layer may be a molybdenum (Mo) layer, as shown in FIGS. 4A-4B and described in more detail below.

Figure 4A:
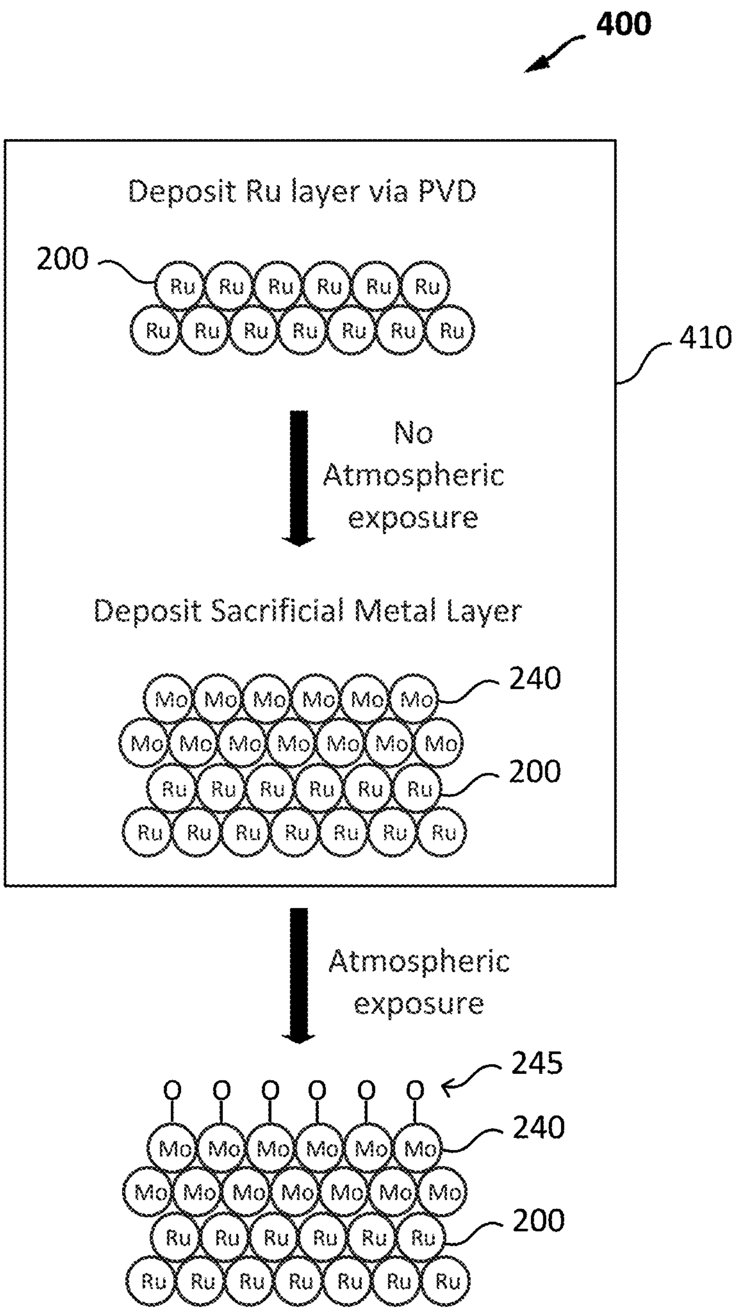
FIG. 4A is a schematic diagram of process steps that can be used to protect a surface of a ruthenium layer by depositing a sacrificial metal layer on the ruthenium surface immediately after depositing the ruthenium layer without exposing the substrate to air or other oxidizing environments.

FIG. 4A illustrates a process flow 400 used to protect a ruthenium layer by forming a sacrificial metal layer (e.g., a sacrificial molybdenum (Mo) layer) on the ruthenium surface immediately after depositing the ruthenium layer without exposing the substrate to air or other oxidizing environments. As noted above and shown in FIG. 2A, the ruthenium surface 200 of a ruthenium layer deposited via PVD may be initially un-passivated upon deposition, but quickly re-passivated with an oxidative passivation layer 210 when exposed to air or other oxidizing environments. To prevent oxidative passivation of the ruthenium surface 200, a relatively thin (e.g., 1-5 nm) sacrificial metal layer can be deposited onto the ruthenium surface 200 immediately after the ruthenium layer is deposited on a substrate without exposing the substrate to air or other oxidizing environments, as shown in FIG. 4A. The sacrificial metal layer is preferably thin enough to be removed quickly during etching, but thick enough to block oxidation of the underlying ruthenium surface 200. The sacrificial metal layer replaces the previously exposed ruthenium surface 200 with a metal-metal interface. The ruthenium atoms at the metal-metal interface are sufficiently coordinated by the metal atoms of the sacrificial metal layer. By covering the ruthenium surface 200 with a sacrificial metal layer thick enough to prevent sub-surface oxidation, the process flow 400 avoids forming an oxidative passivation layer 210 on the ruthenium surface 200, as shown in FIG. 2A.

In the process flow 400 shown in FIG. 4A, the sacrificial metal layer is deposited on the ruthenium surface 200 in the same process chamber 410 (e.g., a PVD process chamber) used to deposit the ruthenium layer immediately after the ruthenium layer is deposited on the substrate. In some cases, an oxidative passivation layer 245 may form on the surface 240 of the sacrificial metal layer, instead of the ruthenium surface 200, when the substrate is removed from the process chamber 410 and exposed to air or other oxidizing environments. However, the sacrificial metal layer and the oxidative passivation layer 245 formed thereon may be much easier to etch in the wet etch chemistry used to etch the bulk ruthenium layer, than the oxidative passivation layer 210 shown and described in FIG. 2A. The sacrificial metal layer may also avoid forming ruthenium metal-oxides (e.g., a $RuO_2$ or $RuO_4$) and/or other ruthenium species having oxidation states higher than 3+ on the ruthenium surface 200 when the substrate is exposed to the wet etch chemistry. As a result, the sacrificial metal layer may increase the etch rate and optimize the ruthenium wet etch process by preventing oxidative passivation of the ruthenium surface 200 before and during the wet etch process.

Figure 4B:
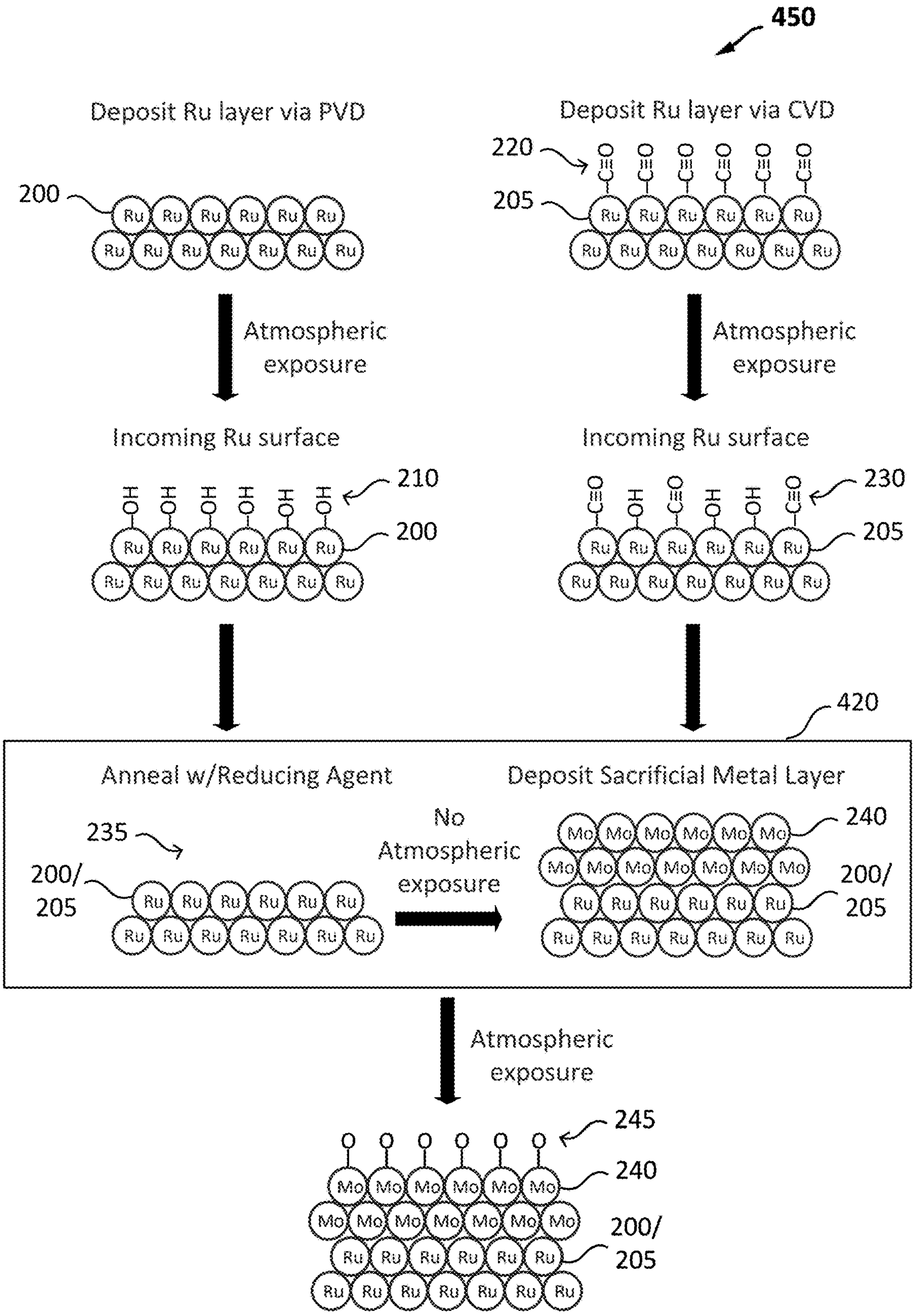
FIG. 4B is a schematic diagram of process steps that can be used to protect a surface of a ruthenium layer by depositing a sacrificial metal layer on the ruthenium surface after exposing the substrate to air or other oxidizing environments.

FIG. 4B illustrates a process flow 450 used to protect a ruthenium layer by forming a sacrificial metal layer on the ruthenium surface after the substrate has been exposed to air or other oxidizing environments. In the process flow 450 shown in FIG. 4B, a ruthenium layer deposited via PVD (left side of FIG. 4B) or CVD (right side of FIG. 4B) is exposed to air or other oxidizing environments before a sacrificial metal layer is deposited onto the ruthenium surface 200/205. As noted above and shown in FIGS. 2A and 4B, the ruthenium surface 200 of the PVD-deposited ruthenium layer is quickly re-passivated with an oxidative passivation layer 210 comprising oxide, hydroxyl or hydrate groups when exposed to air or other oxidizing environments. On the other hand, the ruthenium surface 205 of the CVD-deposited ruthenium layer may have a carbonyl passivation layer 220 formed thereon upon deposition, or a mixed-valence passivation layer 230 if the CVD-deposited ruthenium layer is not etched immediately after deposition. As shown in FIGS. 2B and 4B, the mixed-valence passivation layer 230 may comprise a mixture of bound CO ligands and oxide, hydroxyl or hydrate groups, as a result of oxidative degradation of the ruthenium surface 205 or other processing steps performed prior to etching. In the process flow 450 shown in FIG. 4B, the oxidative passivation layer 210 formed on the incoming ruthenium surface 200 and the mixed-valence passivation layer 230 formed on the incoming ruthenium surface 205 must be removed before the sacrificial metal layer is deposited onto the ruthenium surface 200/205 to prevent oxidation of the ruthenium surface 200/205. These passivation layers may generally be removed by annealing the substrate in a reducing atmosphere.

As used herein, a substrate is annealed in a reducing atmosphere by exposing the substrate to a gaseous reducing agent and a relatively high temperature. As known in the art, a "reducing agent" is a chemical species that reduces another element, molecule or compound by donating an electron to the other element, molecule or compound (i.e., an electron recipient) during an oxidation-reduction reaction. In some reactions, the reducing agent loses an electron to, and absorbs oxygen (O) from, the electron recipient. In doing so, the reducing agent becomes oxidized and the electron recipient becomes reduced (by losing an oxygen atom). In the embodiments disclosed herein, the gaseous reducing agent used during the anneal step may reduce the incoming ruthenium surface 200/205 by desorbing oxygen-containing ligands (e.g., oxide, hydroxide or hydrate groups) bound to the ruthenium surface 200/205.

Figure 5B:
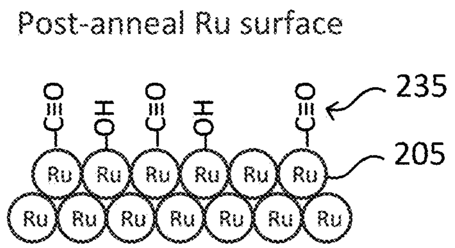
FIG. 5B is a schematic diagram illustrating an example post-anneal ruthenium surface after an $H_2$ anneal at 150° C.
Figure 6B:
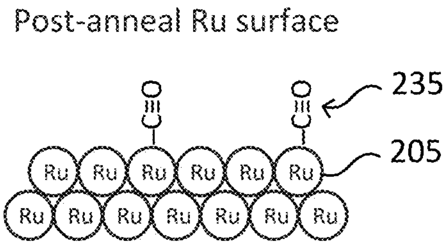
FIG. 6B is a schematic diagram illustrating an example post-anneal ruthenium surface after an $H_2$ anneal at 250° C.
Figure 7A:
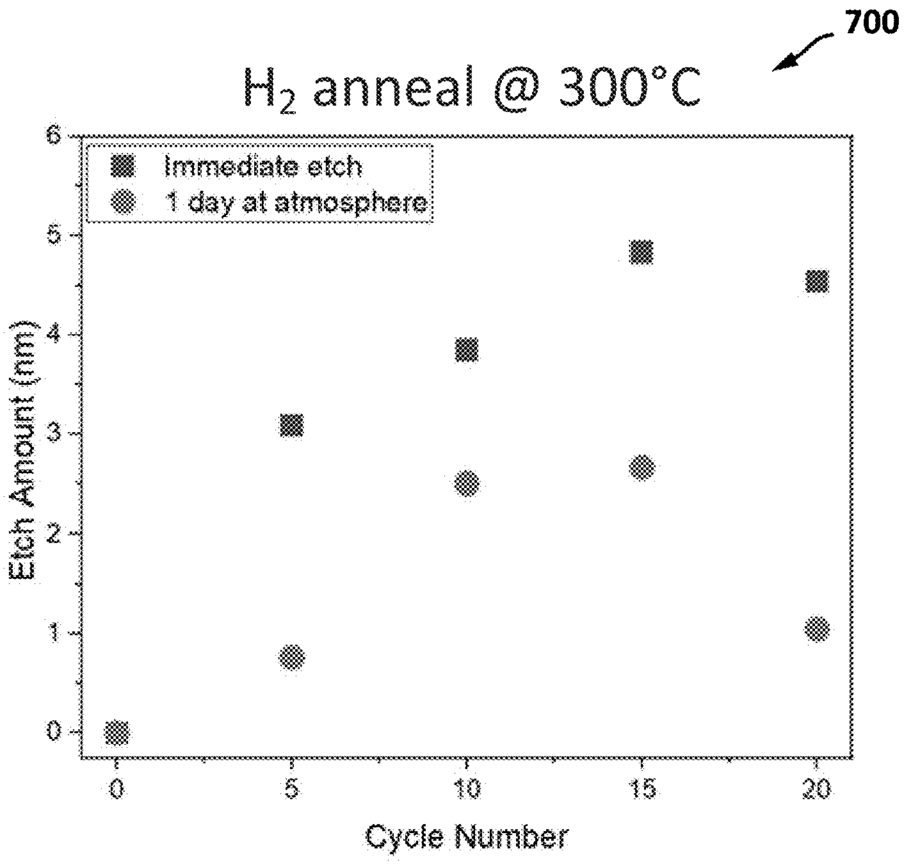
FIG. 7A is a graph illustrating exemplary etch rate (expressed in nm/cycle) achieved for a CVD-deposited ruthenium coupon etched after an $H_2$ anneal at 300° C., both: (a) immediately after the $H_2$ anneal, and (b) 1 day after atmospheric exposure.
Figure 7B:
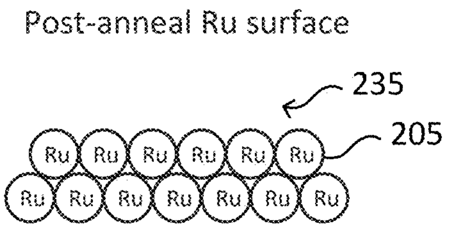
FIG. 7B is a schematic diagram illustrating an example post-anneal ruthenium surface after an $H_2$ anneal at 300° C.

In some embodiments, the gaseous reducing agent may fully reduce the ruthenium surface 200/205 by desorbing all ligand groups bound to the ruthenium surface 200/205, leaving a relatively clean post-anneal ruthenium surface 235 as shown in FIGS. 4B and 7B. In other embodiments, the gaseous reducing agent may partially reduce the post-anneal ruthenium surface 235 by desorbing some (but not all) of the ligand groups bound to the post-anneal ruthenium surface 235, leaving a partially reduced post-anneal ruthenium surface 235 as shown in FIGS. 5B and 6B.

A wide variety of gaseous reducing agents can be used to in the anneal step. Examples of gaseous reducing agents include, but are not limited to, hydrogen ($H_2$), hydrazine ($N_2H_4$), carbon monoxide (CO), ammonia ($NH_3$), methane ($CH_4$), formic acid ($CH_2O_2$) and other volatile carboxylic acids. In one example embodiment, the incoming ruthenium surface 200/205 may be annealed by exposing the substrate to a relatively high temperature ranging, for example, between 150° C. and 250° C., in a hydrogen ($H_2$) gas ambient environment. Relatively high temperatures are required to thermally activate hydrogen as a reducing agent. During the anneal, the $H_2$ gas (i.e., the reducing agent) at least partially reduces the ruthenium surface 200/205 by desorbing oxide, hydroxide or hydrate groups bound to the ruthenium surface 200/205. The amount of reduction may generally depend on the reducing agent and temperature used during the anneal step, as described in more detail below in reference to FIGS. 5-7. Some of the CO ligands bound to the ruthenium surface 205 may also be desorbed, depending on the temperature used during the anneal step.

In the process flow 400 shown in FIG. 4B, a sacrificial metal layer (e.g., a sacrificial molybdenum (Mo) layer) is deposited on the post-anneal ruthenium surface 235 in the same process chamber 420 in which the substrate is annealed to avoid atmospheric exposure and reoxidation of the post-anneal ruthenium surface 235. Similar to the previous embodiment, the sacrificial metal layer replaces the post-anneal ruthenium surface 235 with a metal-metal interface, thereby preventing the post-anneal ruthenium surface 235 from being oxidized when the substrate is removed from the process chamber 420 and exposed to air or other oxidizing environments. Although an oxidative passivation layer 245 may form on the surface 240 of the sacrificial metal layer when the substrate is removed from the process chamber 420, the sacrificial metal layer and the oxidative passivation layer 245 formed thereon may be much easier to etch in the wet etch chemistry used to etch the bulk ruthenium layer, than the oxidative passivation layer 210 shown and described in FIG. 2A. The sacrificial metal layer may also avoid forming ruthenium metal-oxides (e.g., a $RuO_2$ or $RuO_4$) and/or other ruthenium species having oxidation states higher than 3+ on the ruthenium surface 200 when the substrate is exposed to the wet etch chemistry. As a result, the sacrificial metal layer may increase the etch rate and optimize the ruthenium wet etch process by preventing oxidative passivation of the post-anneal ruthenium surface 235 before and during the wet etch process.

The process flows 400 and 450 shown in FIGS. 4A and 4B protect a ruthenium surface exposed on a substrate by: (a) depositing a sacrificial metal layer on the ruthenium surface immediately after the ruthenium layer is deposited on the substrate without exposing the substrate to air or other oxidizing environments, or (b) annealing the substrate in a reducing atmosphere to reduce the ruthenium surface before depositing the sacrificial metal layer on the post-annealed ruthenium surface. As noted above, annealing the substrate in a reducing atmosphere may partially or fully reduce the ruthenium surface, depending on the reducing agent and temperature used during the anneal step.

Etching experiments were conducted to investigate results of annealing ruthenium films in a hydrogen ($H_2$) atmosphere. Annealing was performed by placing CVD-deposited ruthenium coupons in a cold-wall reactor with a heated chuck. The chamber was evacuated to <1e-5 Torr before backfilling to 25 Torr with forming gas. The partial pressure of hydrogen in the chamber was approximately 1.25 Torr. After the chuck holding a ruthenium coupon reached a desired temperature (e.g., 150° C., 250° C. or 300° C.), it was allowed to cool naturally in the $H_2$ ambient. After removal from the chamber, half of the CVD-deposited ruthenium coupon was etched immediately, while the other half was etched 24 hours after atmospheric exposure.

Figure 5A:
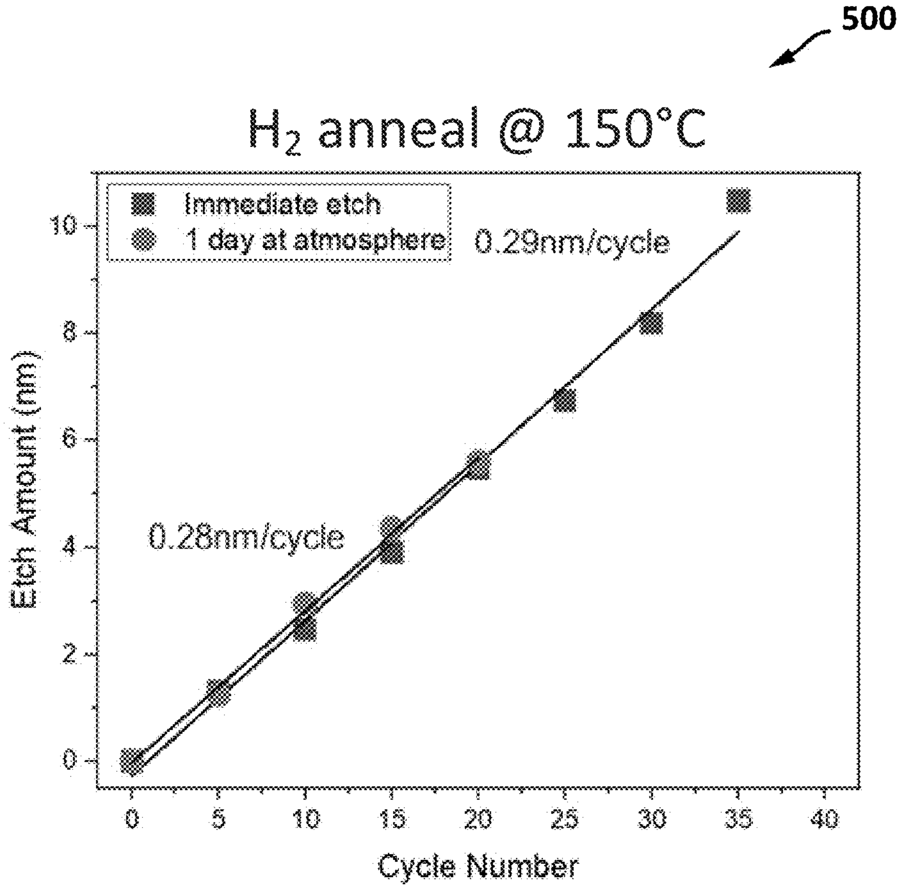
FIG. 5A is a graph illustrating exemplary etch rate (expressed in nm/cycle) achieved for a CVD-deposited ruthenium coupon etched after a hydrogen ($H_2$) anneal at 150° C., both: (a) immediately after the $H_2$ anneal, and (b) 1 day after atmospheric exposure.

The graph 500 shown in FIG. 5A depicts the etch rate (expressed in nm/cycle) achieved for a CVD-deposited ruthenium coupon etched after an $H_2$ anneal at 150° C., both: (a) immediately after the $H_2$ anneal, and (b) 1 day after atmospheric exposure. As shown in FIG. 5A, the ruthenium coupon etched immediately after the $H_2$ anneal at 150° C. shows an increase in etch rate (e.g., 29 nm/cycle) compared to the etch rates achieved in FIG. 3. The graph 500 further shows that the increase in etch rate (e.g., 28 nm/cycle) was retained after 24 hours at atmosphere. It's likely that the post-anneal ruthenium surface 235 was only partially reduced at this temperature, as depicted in the example shown in FIG. 5B. Carbonyl groups remaining on the post-anneal ruthenium surface 235 after annealing at 150° C. may also contribute to the increase in etch rate.

Figure 6A:
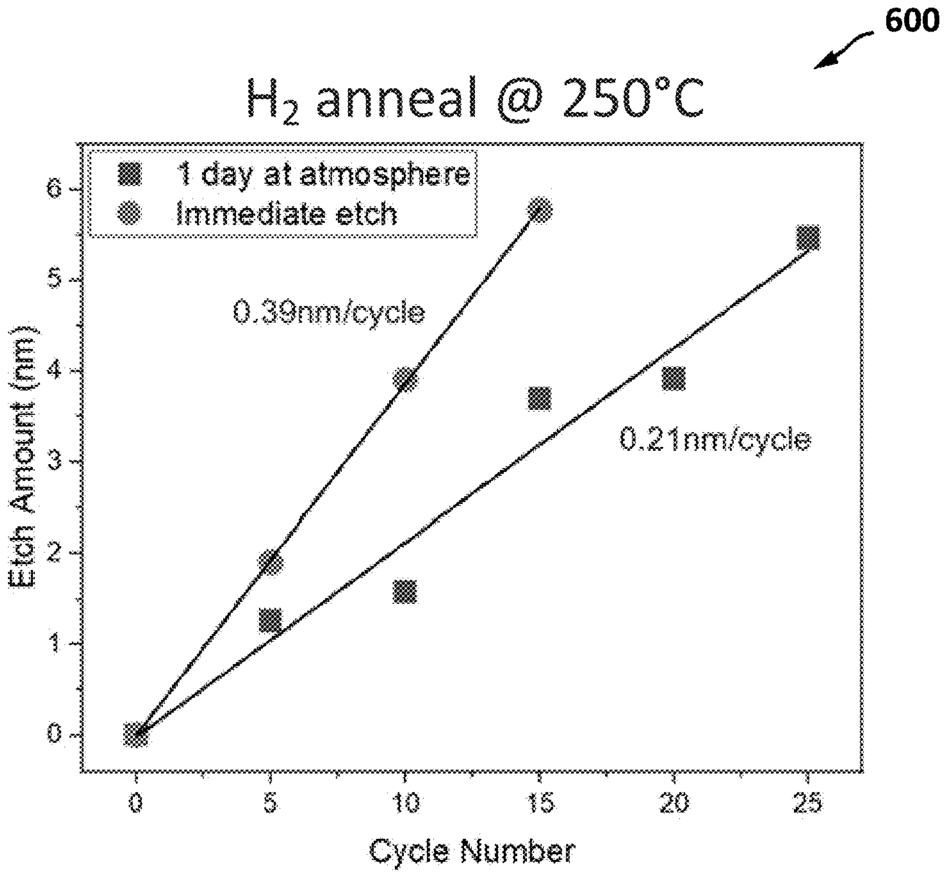
FIG. 6A is a graph illustrating exemplary etch rate (expressed in nm/cycle) achieved for a CVD-deposited ruthenium coupon etched after an $H_2$ anneal at 250° C., both: (a) immediately after the $H_2$ anneal, and (b) 1 day after atmospheric exposure.

The graph 600 shown in FIG. 6A depicts the etch rate (expressed in nm/cycle) achieved for a CVD-deposited ruthenium coupon etched after an $H_2$ anneal at 250° C., both: (a) immediately after the $H_2$ anneal, and (b) 1 day after atmospheric exposure. As shown in FIG. 6A, the ruthenium coupon etched immediately after the $H_2$ anneal at 250° C. shows a larger increase in etch rate (e.g., 39 nm/cycle) compared to the etch rates achieved in FIG. 3. However, the etch rate achieved after 24 hours at atmosphere (e.g., 21 nm/cycle) was nearly cut in half. The etch results shown in the graph 600 are consistent with a more complete reduction of the ruthenium surface 205, but also a partial desorption of the carbonyl groups present on the ruthenium surface 205 before annealing, as shown in the comparison of FIGS. 2B and 6B. The decrease in etch rate after 24 hours at atmosphere (e.g., 39 nm/cycle to 21 nm/cycle) may be attributed to the desorption of the carbonyl groups at the higher anneal temperature (e.g., 250° C. vs 150° C.), as this may allow faster re-oxidation of the ruthenium surface 205, compared to the ruthenium coupon annealed to 150° C..

The graph 700 shown in FIG. 7A depicts the etch rate (expressed in nm/cycle) achieved for a CVD-deposited ruthenium coupon etched after an $H_2$ anneal at 300° C., both: (a) immediately after the $H_2$ anneal, and (b) 1 day after atmospheric exposure. As shown in FIG. 7A, the ruthenium coupon annealed to 300° C. shows saturating etch behavior for the coupons etched immediately and after 24 hours of atmospheric exposure, with even lower etch rates achieved after 24 hours of atmospheric exposure. This could indicate both full reduction of the post-anneal ruthenium surface 235 and complete desorption of carbonyl groups, as shown in the example provided in FIG. 7B. This leaves the post-anneal ruthenium surface 235 completely open to rapid re-oxidation on the timescale of the etch experiments.

This post-anneal etch data shown in FIGS. 5A, 6A and 7A suggests that the loss of etch activity observed after long term exposure of CVD-deposited ruthenium films to atmospheric conditions is due to an oxidative process. Annealing in a reducing atmosphere is enough to at least partially regain previous etch behavior. However, there is a tradeoff between the peak etch rate achieved immediately after annealing, and the timescale for re-oxidation of the ruthenium surface. As shown in FIGS. 5A, 6A and 7A, higher annealing temperatures lead to faster initial etch rates, but also faster surface re-oxidation. This indicates that additional measures may be needed to fully recover both the high etch rates and the oxidation resistance that the CVD-deposited ruthenium films possessed immediately after deposition.

In the present disclosure, a sacrificial metal layer is deposited onto a ruthenium layer immediately after deposition (as shown in FIG. 4A) or immediately after annealing the substrate to desorb any oxide, hydroxide or hydrate groups bound to the ruthenium surface (as shown in FIG. 4B). In some embodiments, the sacrificial metal layer formed on the ruthenium surface 200/205 or the post-annealed ruthenium surface 235 may optimize the ruthenium wet etch process by preventing oxidative passivation of the ruthenium surface before and during the ruthenium wet etch process.

In some embodiments, the sacrificial metal layer may increase the etch rate of the ruthenium layer, compared to an etch rate achieved without the sacrificial metal layer, when a wet etch chemistry that primarily uses halogenation, rather than oxidation, is used to chemically modify the ruthenium surface and form a ruthenium halide or oxyhalide passivation layer on the ruthenium surface. For example, and as noted above with regard to the wet ALE process shown in FIG. 1, an electrophilic halogenating agent can be used to form a ruthenium halide or oxyhalide passivation layer on the ruthenium surface, which is self-limiting and insoluble in the surface modification solution 115, but freely soluble in the dissolution solution 145. In some embodiments, TCCA (an electrophilic chlorinating agent) can be used to form a ruthenium chloride passivation layer on the ruthenium surface. Thermodynamically, exposing the ruthenium surface to TCCA should lead to the formation of a ruthenium trichloride ($RuCl_3$) passivation layer in the 3+ oxidation state. However, TCCA is susceptible to hydrolysis by surface hydroxides and hydrates. Hydrolysis of TCCA forms hypochlorous acid (HClO), which is a well-known oxidizer capable of forming ruthenium dioxide ($RuO_2$) on the ruthenium surface. Since $RuO_2$ is in the 4+ oxidation state, it must be reduced to form a ruthenium halide passivation layer. However, TCCA cannot act as a reducing agent, so the presence of $RuO_2$ on the ruthenium surface will poison the etch and decrease the etch rate. Surface hydroxides and hydrates can also be harmful to the etch. Thus, any oxidative passivation of the ruthenium surface is capable of poisoning the halogenation reaction by TCCA.

In some embodiments, the sacrificial metal layer formed on the ruthenium surface 200/205 or the post-annealed ruthenium surface 235 may optimize the ruthenium wet etch process by: (a) preventing oxidative surface passivation of the ruthenium layer, and (b) keeping surface ruthenium atoms in the zero valent state when using halogen-based wet etch chemistries to etch the ruthenium layer. During the halogenation reaction, the zero valent metal centers are open to oxidation to the 3+ state to form a ruthenium halide or oxyhalide passivation layer on the ruthenium surface. For example, TCCA may oxidize the ruthenium surface to from a ruthenium chloride (e.g., $RuCl_3$) passivation layer in the 3+ oxidation state. The sacrificial metal layer formed on the ruthenium surface 200/205 or the post-annealed ruthenium surface 235 prevents hydrolysis of TCCA through reactions with surface hydroxyl or hydrate groups, and thus, prevents $RuO_2$ formation and oxidation states higher than 3+. In doing so, the sacrificial metal layer optimizes the ruthenium wet etch process by preventing conditions that poison the etch.

The halogen-based wet etch chemistries used in the '342 Patent to etch ruthenium (Ru) will also etch other transition metals. Etch experiments were performed to investigate the etch behavior of tungsten (W), molybdenum (Mo), tantalum (Ta), cobalt (Co), copper (Cu), platinum (Pt) and nickel (Ni) using an extremely low concentration of TCCA dissolved in ethyl acetate (EA). Although the concentration of TCCA used in the etch experiments was much lower than is typically used for etching ruthenium (e.g., ~50 times less than the best-known chemistry developed for Ru etch), it shows that etch of other transition metals is possible. All of the metal samples were etched with their native oxides intact. Rapid etch indicates that both the transition metal and its oxide can be removed using the TCCA-EA chemistry.

Figure 8:
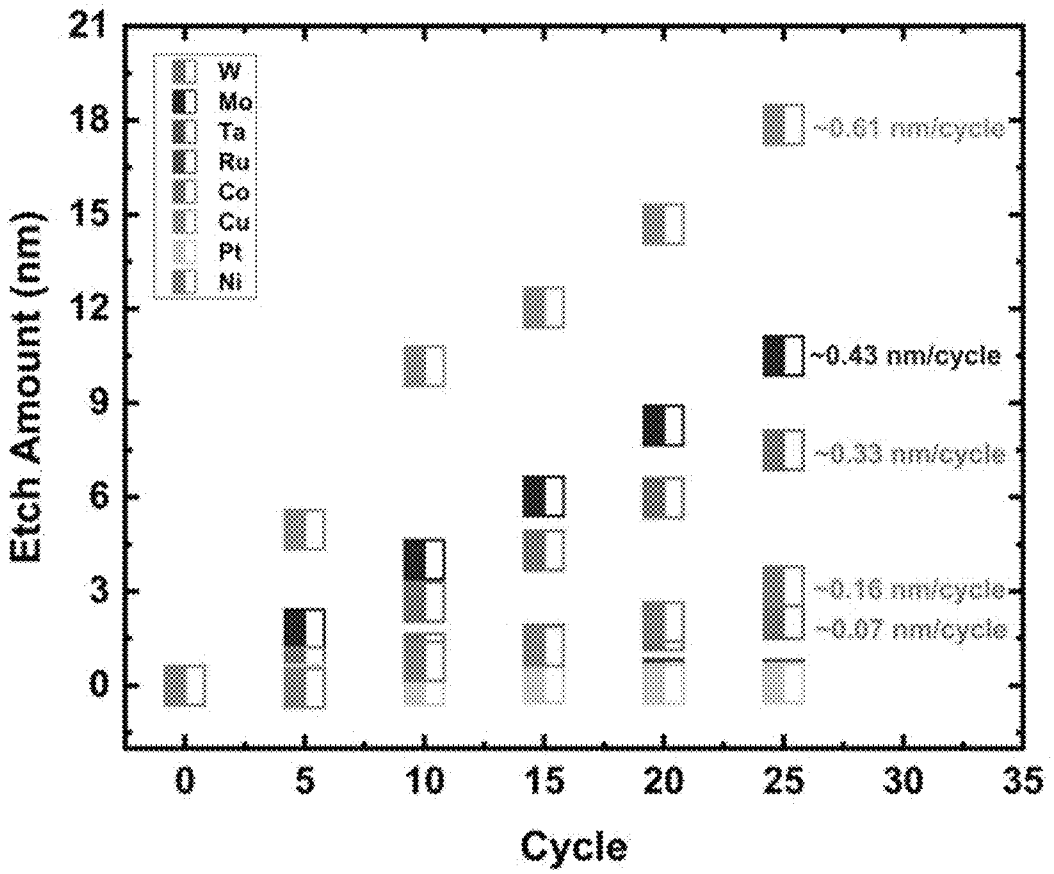
FIG. 8 is a graph depicting exemplary etch rates (expressed in nm/cycle) achieved as a function of cycle (expressed in cycle number) when etching various transition metal surfaces in a wet ALE process using 0.1% TCCA dissolved in ethyl acetate in the surface modification solution and 5 mM of $NH_4OH$ and 10 mM of ascorbic acid dissolved in water in the dissolution solution.

The graph 800 shown in FIG. 8 depicts the exemplary etch rates (expressed in nm/cycle) achieved as a function of cycle (expressed in cycle number) when etching tungsten (W), molybdenum (Mo), tantalum (Ta), ruthenium (Ru), cobalt (Co), copper (Cu), platinum (Pt) and nickel (Ni) surfaces in a wet ALE process using 0.1% TCCA dissolved in ethyl acetate in the surface modification solution and 5 mM of $NH_4OH$ and 10 mM of ascorbic acid dissolved in water in the dissolution solution. The etch recipe used to obtain the results shown in the graph 800 included multiple ALE cycles, where each cycle includes: (a) a 10 second dip in 0.1% TCCA in ethyl acetate solution, (b) an ethyl acetate, deionized water and IPA rinse and blow dry, (c) a 10 second dip in 5 mM $NH_4OH$+10 mM ascorbic acid solution, and (d) a deionized water and IPA rinse and blow dry.

As shown in the graph 800, the extremely low concentrations of TCCA used in the surface modification solution is not sufficient to etch Ta, Ru and Pt surfaces. However, even at low TCCA concentrations, the surface modification and dissolution solutions easily etch Cu (~0.61 nm/cycle), Mo (~0.43 nm/cycle) and W (~0.33 nm/cycle), making these metals prime candidates for the sacrificial metal layer. The graph 800 shows that Ni (~0.16 nm/cycle) and Co (~0.07 nm/cycle) are also etched, albeit at much slower etch rates. Although Ni and Co may be used as a sacrificial metal layer, removal of a Ni or Co sacrificial metal layer will take longer compared to the removal of a Cu, Mo or W sacrificial metal layer.

The etch results depicted in FIG. 8 show that various transition metals and their native oxides can be etched using the halogen-based wet etch chemistries used to etch ruthenium. The presence of the sacrificial metal layer protects the ruthenium surface from oxidation, and even though the sacrificial metal layer may undergo surface oxidation to form a passivation layer, the formation of this layer is easily removed by the halogen-based wet etch chemistry used to etch the bulk ruthenium layer.

An example process flow in accordance with the present disclosure involves deposition and then etching of ruthenium, as shown in the process flow 400 of FIG. 4A. First a ruthenium layer is deposited on a surface using CVD, PVD, or other deposition techniques. After the desired amount of ruthenium is deposited, a sacrificial metal layer is immediately deposited onto the ruthenium surface in the same process chamber used to deposit the ruthenium layer. In this example process flow, the sacrificial metal layer is deposited on the ruthenium surface before the substrate is exposed to air or other oxidizing environments to avoid forming an oxidative passivation layer on the ruthenium surface before etching the ruthenium layer. Ideally, both depositions would occur in the same process chamber. The sacrificial metal layer deposition could be done by CVD, PVD, or another deposition technique.

In another example process flow, a ruthenium layer previously deposited on a surface using CVD, PVD, or other deposition techniques may be annealed to reduce the ruthenium surface and remove any oxygen-containing ligands bound to the ruthenium surface before a sacrificial metal layer is deposited onto the post-annealed ruthenium surface, as shown in the process flow 450 of FIG. 4B. In such a process flow, the sacrificial metal layer may be deposited within the same (or different) process chamber using the same (or different) deposition technique used to deposit the ruthenium layer on the substrate. However, the sacrificial metal layer is preferably deposited within the same process chamber in which the substrate is annealed to prevent re-oxidation of the post-annealed ruthenium surface.

The sacrificial metal layer disclosed herein can be relatively thin, ideally only a few nanometers thick. Preferably, the sacrificial metal layer is thin enough to be quickly removed during etching, but thick enough to block oxidation of the underlying ruthenium layer. Once the sacrificial metal layer is in place, the substrate may be exposed to atmosphere. Although atmospheric exposure may lead to the rapid formation of an oxidized passivation layer on the sacrificial metal layer, the ruthenium surface will remain unoxidized. Many transition metal oxides are incredibly stable and can act as a diffusion barrier to sub-surface oxidation. In this way, the oxide passivation on the sacrificial metal layer may protect the ruthenium interface from oxidation.

When it is desired to etch the ruthenium layer, the substrate is exposed to a wet etch chemistry that has been optimized for the bulk ruthenium layer. At the beginning of the wet etch process, the sacrificial metal layer is etched by the wet etch chemistry first to expose the ruthenium layer underlying the sacrificial metal layer. Once the sacrificial metal layer is removed from the ruthenium surface, the wet etch chemistry will seamlessly move on to etching the underlying ruthenium layer. By depositing the sacrificial metal layer in-situ, and removing the sacrificial metal layer as part of the ruthenium etch process, the ruthenium surface is never given an opportunity to form a difficult to etch, oxidative passivation layer.

Figure 9:
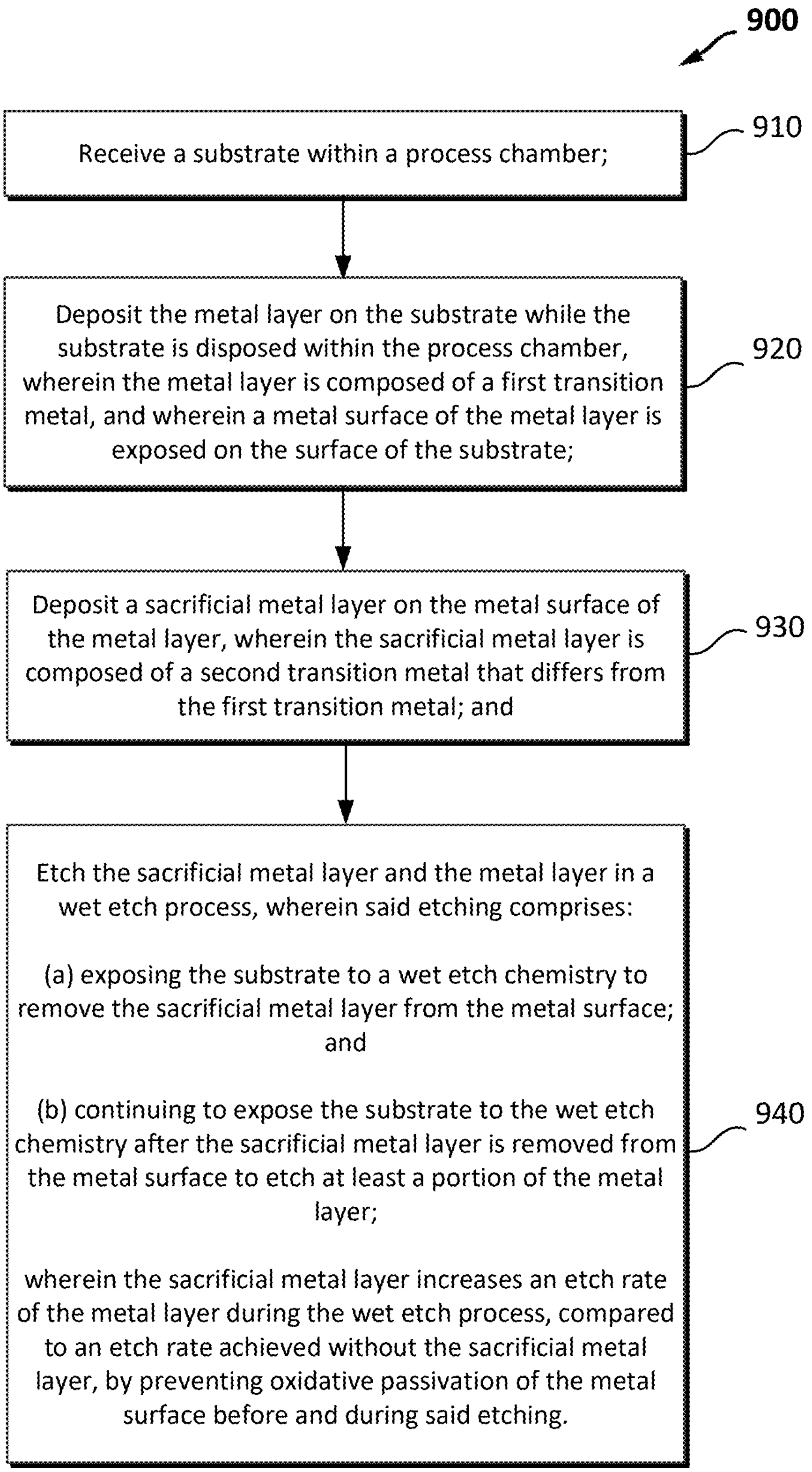
FIG. 9 is a flowchart diagram illustrating one embodiment of a method that utilizes the techniques described herein.
Figure 10:
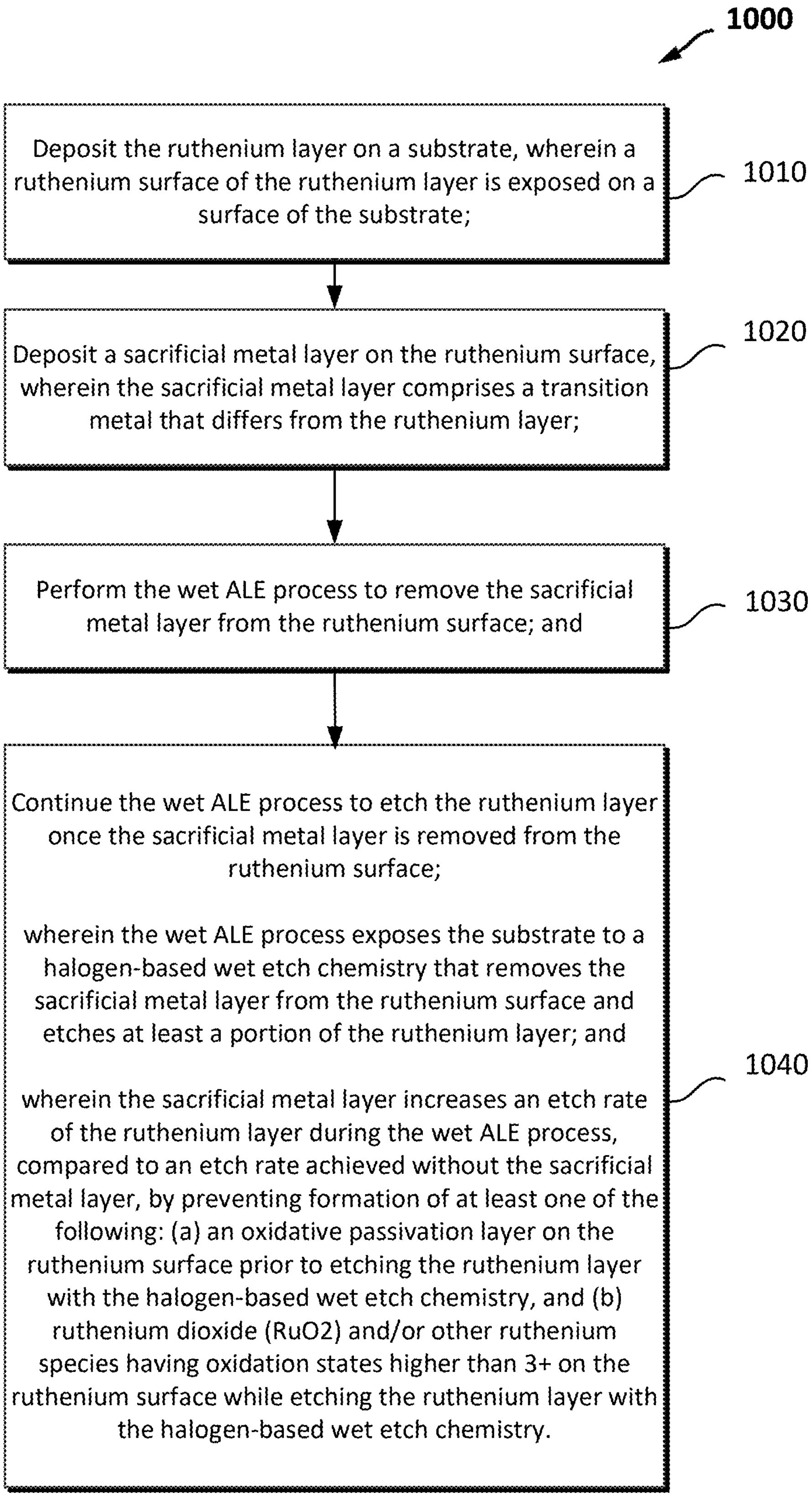
FIG. 10 is a flowchart diagram illustrating another embodiment of a method that utilizes the techniques described herein.

FIGS. 9-10 illustrate exemplary methods that utilize the techniques disclosed herein to protect a surface of a metal layer to be etched prior to etching the metal layer. In some embodiments, the methods shown in FIGS. 9-10 may be used to protect a surface of a ruthenium (Ru) layer to be etched prior to etching the ruthenium layer in a wet atomic layer etching (ALE) process. It will be recognized that the embodiments of FIGS. 9-10 are merely exemplary and additional methods may utilize the techniques described herein. Further, additional processing steps may be added to the methods shown in the FIGS. 9-10 as the steps described are not intended to be exclusive. Moreover, the order of the steps is not limited to the order shown in the figures as different orders may occur and/or various steps may be performed in combination or at the same time.

FIG. 9 illustrates one embodiment of a method 900 that can be used to condition a surface of a metal layer to be etched prior to etching the metal layer. The method 900 may generally include: (a) receiving a substrate within a process chamber (in step 910); (b) depositing the metal layer on the substrate while the substrate is disposed within the process chamber, wherein the metal layer is composed of a first transition metal, and wherein a metal surface of the metal layer is exposed on the surface of the substrate (in step 920); (c) depositing a sacrificial metal layer on the metal surface of the metal layer, wherein the sacrificial metal layer is composed of a second transition metal that differs from the first transition metal (in step 930); and (d) etching the sacrificial metal layer and the metal layer in a wet etch process (in step 940). The wet etch process performed in step 940 may generally include: (i) exposing the substrate to a wet etch chemistry to remove the sacrificial metal layer from the metal surface, and (ii) continuing to expose the substrate to the wet etch chemistry after the sacrificial metal layer is removed from the metal surface to etch at least a portion of the metal layer In the method 900, the sacrificial metal layer deposited in step 930 increases the etch rate of the metal layer during the wet etch process performed in step 940, compared to an etch rate that would have been achieved without the sacrificial metal layer, by preventing oxidative passivation of the metal surface before and during the wet etch process performed in step 940.

The metal layer deposited on the substrate in step 920 may include a wide variety of transition metals. For example, the metal layer may be a ruthenium (Ru) layer, an osmium (Os) layer, a tantalum (Ta) layer, a niobium (Nb) layer, a titanium (Ti) layer, a zirconium (Zr) layer or a hafnium (Hf) layer. In one embodiment, the metal layer may be a ruthenium (Ru) layer having a ruthenium surface exposed on the surface of the substrate. The ruthenium layer may be deposited on the substrate in step 920 using various deposition techniques (e.g., CVD, PVD, ALD, etc.).

The sacrificial metal layer deposited in step 930 may be a relatively thin transition metal layer (e.g., approximately 1-5 nm thick), which differs from the bulk metal layer, but is soluble within the wet etch chemistry used to etch the bulk metal layer. For example, when the metal layer etched in step 940 is a ruthenium (Ru) layer, the sacrificial metal layer may be a copper (Cu) layer, a molybdenum (Mo) layer, a tungsten (W) layer, a nickel (Ni) layer, a cobalt (Co) layer, a platinum (Pt) layer, a gold (Au) layer, or an iridium (Ir) layer. In some embodiments, the sacrificial metal layer may be deposited on the metal surface (in step 930) while the substrate is disposed within the process chamber, and without exposing the substrate to air or other oxidizing environments, to avoid forming an oxidative passivation layer on the metal surface before said etching.

In other embodiments, the method 900 may anneal the substrate in a reducing atmosphere reduce the metal surface before depositing the sacrificial metal layer on the metal surface (in step 930). As noted above, the substrate may be annealed by exposing the substrate to a gaseous reducing agent and a temperature ranging between 100° C. and 500° C. to at least partially reduce the metal surface. A wide variety of gaseous reducing agents can be used during the anneal step to reduce the metal surface. For example, the gaseous reducing agent used during the anneal step may comprise hydrogen ($H_2$), hydrazine ($N_2H_4$), carbon monoxide (CO), ammonia ($NH_3$), methane ($CH_4$), formic acid ($CH_2O_2$) or another volatile carboxylic acid.

In one example embodiment, the metal layer may be a ruthenium (Ru) layer having a ruthenium surface exposed on the surface of the substrate, and the substrate may be annealed by exposing the substrate to a relatively high temperature (ranging, e.g., between 150° C. and 250° C.) in a hydrogen ($H_2$) gas ambient. The $H_2$ gas (i.e., the gaseous reducing agent) may at least partially reduce the ruthenium surface by desorbing oxide, hydroxide or hydrate groups bound to the ruthenium surface. The amount of reduction achieved may generally depend on the reducing agent and temperature used during the anneal step. For example, an $H_2$ anneal performed at 150° C. may result in a partial reduction of the ruthenium surface, whereas an $H_2$ anneal performed at (or above) 250° C. may result in a full reduction of the ruthenium surface, as shown in the experimental results depicted in FIGS. 5A, 6A and 7A. Other anneal temperatures within this range may also be used to provide a partial or full reduction of the ruthenium surface during the anneal step.

A wide variety of wet etch processes can be used to etch the sacrificial metal layer and the metal layer (in step 940). In some embodiments, the sacrificial metal layer and the metal layer may be etched (in step 940) by performing multiple cycles of a wet ALE process (or another wet etch process) that uses a halogen-based wet etch chemistry to chemically modify exposed surfaces of the metal layers and form self-limiting passivation layers, which are insoluble in the halogen-based wet etch chemistry, but readily soluble in another solution used to selectively remove the passivation layers. The halogen-based wet etch chemistry may generally include an electrophilic halogenation agent dissolved in a non-aqueous solvent. For example, the electrophilic halogenation agent may be an electrophilic chlorinating agent, an electrophilic fluorinating agent or an electrophilic brominating agent, and the non-aqueous solvent may be an ether, a ketone, a halocarbon, a heterocyclic, an alcohol or another polar organic solvent.

In some embodiments, the metal layer being etched in step 940 may be a ruthenium (Ru) layer. In such embodiments, the sacrificial metal layer deposited on the ruthenium surface (in step 930) may protect the ruthenium surface by preventing formation of at least one of the following: (a) an oxidative passivation layer on the ruthenium surface prior to etching the ruthenium layer with the halogen-based wet etch chemistry, and (b) ruthenium dioxide ($RuO_2$) and/or other ruthenium species having oxidation states higher than 3+ on the ruthenium surface while etching the ruthenium layer with the halogen-based wet etch chemistry.

FIG. 10 illustrates one embodiment of a method 1000 that can be used to protect a surface of a ruthenium (Ru) layer to be etched prior to etching the ruthenium layer in a wet atomic layer etching (ALE) process. The method 1000 may generally include: (a) depositing the ruthenium layer on a substrate, wherein a ruthenium surface of the ruthenium layer is exposed on a surface of the substrate (in step 1010); (b) depositing a sacrificial metal layer on the ruthenium surface, wherein the sacrificial metal layer comprises a transition metal that differs from the ruthenium layer (in step 1020); (c) performing the wet ALE process to remove the sacrificial metal layer from the ruthenium surface (in step 1030); and (d) continuing the wet ALE process to etch the ruthenium layer once the sacrificial metal layer is removed from the ruthenium surface (in step 1040).

In the method 1000, the wet ALE process exposes the substrate to a halogen-based wet etch chemistry that removes the sacrificial metal layer from the ruthenium surface and etches at least a portion of the ruthenium layer. The sacrificial metal layer deposited on the ruthenium surface in step 1020 increases an etch rate of the ruthenium layer during the wet ALE process, compared to an etch rate achieved without the sacrificial metal layer, by preventing formation of at least one of the following: (a) an oxidative passivation layer on the ruthenium surface prior to etching the ruthenium layer with the halogen-based wet etch chemistry, and (b) ruthenium dioxide ($RuO_2$) and/or other ruthenium species having oxidation states higher than 3+ on the ruthenium surface when the substrate is exposed to the halogen-based wet etch chemistry.

The sacrificial metal layer deposited in step 1020 may be a relatively thin transition metal layer (e.g., approximately 1-5 nm thick), which differs from the bulk ruthenium layer, but is soluble within the halogen-based wet etch chemistry used to etch the bulk ruthenium layer. For example, the sacrificial metal layer may be a copper (Cu) layer, a molybdenum (Mo) layer, a tungsten (W) layer, a nickel (Ni) layer, a cobalt (Co) layer, a platinum (Pt) layer, a gold (Au) layer, or an iridium (Ir) layer, as noted above. In some embodiments, the sacrificial metal layer may be deposited (in step 1020) after the ruthenium layer is deposited on the substrate (in step 1010) without exposing the substrate to air or other oxidizing environments to avoid forming an oxidative passivation layer on the ruthenium surface before performing the wet ALE process. In other embodiments, the method 1000 may anneal the substrate in a reducing atmosphere to at least partially reduce the metal surface before depositing the sacrificial metal layer on the ruthenium surface (in step 1020).

After the sacrificial metal layer is deposited on the ruthenium surface (in step 1020), the method 1000 may perform the wet ALE process to first remove the sacrificial metal layer (in step 1030) before seamlessly continuing the wet ALE process to etch at least a portion of the ruthenium layer (in step 1040).

In some embodiments, the wet ALE process performed in step 1030 to remove the sacrificial metal layer may include: (a) exposing a transition metal surface of the sacrificial metal layer to a first etch solution comprising an electrophilic halogenation agent dissolved in a non-aqueous solvent to form a transition metal halide or oxyhalide passivation layer, which is self-limiting and insoluble in the non-aqueous solvent; (b) rinsing the substrate with a first purge solution to remove the first etch solution from the surface of the substrate; (c) exposing the transition metal halide or oxyhalide passivation layer to a second etch solution to selectively remove the transition metal halide or oxyhalide passivation layer and expose an unmodified transition metal surface underlying the transition metal halide or oxyhalide passivation layer; (d) rinsing the substrate with a second purge solution to remove the second etch solution from the surface of the substrate and etch the sacrificial metal layer; and (e) repeating said exposing the transition metal surface of the sacrificial metal layer to the first etch solution, rinsing the substrate with the first purge solution, exposing the transition metal halide or oxyhalide passivation layer to the second etch solution, and rinsing the substrate with the second purge solution until the sacrificial metal layer is removed from the ruthenium surface.

In some embodiments, the wet ALE process may continue in step 1040 to etch at least a portion of the ruthenium layer by: (a) exposing the ruthenium surface to the first etch solution comprising the electrophilic halogenation agent dissolved in the non-aqueous solvent to form a ruthenium halide or oxyhalide passivation layer, which is self-limiting and insoluble in the non-aqueous solvent; (b) rinsing the substrate with the first purge solution to remove the first etch solution from the surface of the substrate; (c) exposing the ruthenium halide or oxyhalide passivation layer to the second etch solution to selectively remove the ruthenium halide or oxyhalide passivation layer and expose an unmodified ruthenium surface underlying the ruthenium halide or oxyhalide passivation layer; (d) rinsing the substrate with the second purge solution to remove the second etch solution from the surface of the substrate and etch the ruthenium layer; and (e) repeating said exposing the ruthenium surface to the first etch solution, rinsing the substrate with the first purge solution, exposing the ruthenium halide or oxyhalide passivation layer to the second etch solution, and rinsing the substrate with the second purge solution a number of times until a predetermined amount of the ruthenium layer is removed from the substrate.

A wide variety of etch chemistries can be used in the first etch solution and the second etch solution to etch ruthenium in the method 1000 shown in FIG. 10. For example, the first etch solution may include an electrophilic chlorinating agent, an electrophilic fluorinating agent or an electrophilic brominating agent dissolved in a non-aqueous solvent (e.g., an ether, a ketone, a halocarbon, a heterocyclic, an alcohol or another polar organic solvent), and the second etch solution may be an aqueous dissolution solution containing a ligand (such as, e.g., EDTA, IDA, DTPA, ACAC or AA) and a base (such as, e.g., TMAH, KOH, NaOH, $NH_4OH$ or another strong base). In one example embodiment, the first etch solution may include TCCA dissolved in a polar organic solvent (such as, e.g., ethyl acetate, acetone, acetonitrile or a chlorocarbon), and the second etch solution may be an aqueous solution comprising 1M KOH+100 Mm $(NH_4)_2EDTA$. As noted above, a concentration of the TCCA in the first etch solution may range between 0.2% and 35%. In some embodiments, the second etch solution may be provided at an elevated temperature (such as, e.g., 100° C.). Other examples of etch chemistries that can be used in the first etch solution and the second etch solution to etch the sacrificial metal layer and the ruthenium layer are disclosed further herein. Although etch chemistries are disclosed herein for etching ruthenium in a wet ALE process, one skilled in the art would recognize how the techniques disclosed herein could be used to protect a surface of other metal layers prior to etching such layers using potentially other wet etch chemistries and/or processes.

The sacrificial metal layer deposited in step 1020 optimizes the wet ALE process performed in step 1040 by preventing oxidative passivation of the ruthenium surface and keeping surface ruthenium atoms in the zero valent state. When the ruthenium surface is exposed to a first etch solution comprising a chlorinating agent dissolved in a non-aqueous solvent, the chlorinating agent included within the first etch solution oxidizes the ruthenium surface to from a ruthenium chloride or oxychloride passivation layer, which is self-limiting and insoluble in the non-aqueous solvent. In some embodiments, TCCA dissolved in ethyl acetate may be used in the first etch solution to form a ruthenium trichloride ($RuCl_3$) passivation layer having a 3+ oxidation state on the ruthenium surface. The sacrificial metal layer deposited on the ruthenium surface in step 1020 prevents hydrolysis of TCCA through reactions with surface hydroxyl or hydrate groups, and thus, avoids forming ruthenium dioxide ($RuO_2$) and/or other ruthenium species having oxidation states higher than 3+ on the ruthenium surface. In doing so, the sacrificial metal layer deposited in step 1020 increases the etch rate of the ruthenium layer during the wet ALE process performed in step 1040, compared to an etch rate that would have been achieved without the sacrificial metal layer.

The present disclosure provides various embodiments of methods that can be used to protect a surface of a metal layer prior to etching the metal layer. In the embodiments disclosed herein, a metal surface is protected by depositing a relatively thin (e.g., 1-5 nm) a sacrificial metal layer on the metal surface prior to etching the metal layer with a wet etch chemistry optimized for the bulk metal layer. In some embodiments, a sacrificial metal layer formed on a surface of a ruthenium layer may increase the etch rate of the ruthenium layer by: (a) preventing oxidative surface passivation of the ruthenium layer, and (b) keeping surface ruthenium atoms in the zero valent state when using halogenating etch chemistries (such as, e.g., TCCA-based chemistries) to etch the ruthenium layer.

The methods disclosed herein provide various advantages. For example, the sacrificial metal layer deposited on the post-deposition ruthenium surface (or the post-annealed ruthenium surface) improves the etch rate of ruthenium films etched using TCCA-based wet ALE chemistry and improves etch uniformity between CVD and PVD-deposited ruthenium films. The sacrificial metal layer also improves wafer-to-wafer etch uniformity and reduces etch variations due to differences in queue time by recovering the original etch behavior lost after annealing, chemical oxidations, or other processing steps performed prior to etching.

Although described herein for protecting ruthenium surfaces, the methods disclosed herein can also be used to protect other metal surfaces, and may be particularly useful when a metal oxide or metal hydroxide formation hinders the etch. For example, the methods disclosed herein may be used to protect transition metal surfaces, such as ruthenium (Ru), osmium (Os), tantalum (Ta), niobium (Nb), titanium (Ti), zirconium (Zr) and hafnium (Hf) surfaces, when using halogenating chemistries (such as TCCA) to etch the transition metal surface. However, the methods disclosed herein may be less useful when etching other transition metal surfaces, such as cobalt (Co), copper (Cu), molybdenum (Mo) and tungsten (W) with chemistries that incorporate oxygen, where metal-oxygen bonds are formed as part of the etch cycle.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the methods described herein will be apparent to those skilled in the art in view of this description. It will be recognized, therefore, that the methods described herein are not limited by these example arrangements. It is to be understood that the forms of the methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for protecting a surface of a metal layer to be etched prior to etching the metal layer, the method comprising:
- receiving a substrate within a process chamber;
- depositing the metal layer on the substrate while the substrate is disposed within the process chamber, wherein the metal layer is composed of a first transition metal, and wherein a metal surface of the metal layer is exposed on the surface of the substrate
- depositing a sacrificial metal layer on the metal surface of the metal layer, wherein the sacrificial metal layer is composed of a second transition metal that differs from the first transition metal; and
- etching the sacrificial metal layer and the metal layer in a wet etch process, wherein said etching comprises:
  - exposing the substrate to a wet etch chemistry to remove the sacrificial metal layer from the metal surface; and
  - continuing to expose the substrate to the wet etch chemistry after the sacrificial metal layer is removed from the metal surface to etch at least a portion of the metal layer;
- wherein the sacrificial metal layer increases an etch rate of the metal layer during the wet etch process, compared to an etch rate achieved without the sacrificial metal layer, by preventing oxidative passivation of the metal surface before and during said etching.

2. The method of claim 1, wherein the sacrificial metal layer is deposited on the metal surface while the substrate is disposed within the process chamber, and without exposing the substrate to air or other oxidizing environments, to avoid forming an oxidative passivation layer on the metal surface before said etching.

3. The method of claim 1, further comprising annealing the substrate in a reducing atmosphere to reduce the metal surface before depositing the sacrificial metal layer on the metal surface.

4. The method of claim 3, wherein said annealing the substrate comprises exposing the substrate to a gaseous reducing agent and a temperature ranging between 100° C. and 500° C. to at least partially reduce the metal surface, and wherein the gaseous reducing agent comprises hydrogen ($H_2$), hydrazine ($N_2H_4$), carbon monoxide (CO), ammonia ($NH_3$), methane ($CH_4$), formic acid ($CH_2O_2$) or another volatile carboxylic acid.

5. The method of claim 3, wherein the metal layer is a ruthenium (Ru) layer having a ruthenium surface exposed on the surface of the substrate, and wherein said annealing the substrate comprises exposing the substrate to a hydrogen ($H_2$) gas and a temperature ranging between 150° C. and 250° C. to at least partially desorb any oxide, hydroxide or hydrate groups bound to the ruthenium surface.

6. The method of claim 1, wherein the metal layer is a ruthenium (Ru) layer having a ruthenium surface exposed on the surface of the substrate.

7. The method of claim 6, wherein the sacrificial metal layer is a copper (Cu) layer, a molybdenum (Mo) layer, a tungsten (W) layer, a nickel (Ni) layer, a cobalt (Co) layer, a platinum (Pt) layer, a gold (Au) layer, or an iridium (Ir) layer.

8. The method of claim 6, wherein the sacrificial metal layer is 1 nm to 5 nm thick.

9. The method of claim 6, wherein the wet etch chemistry is a halogen-based wet etch chemistry comprising an electrophilic halogenation agent dissolved in a non-aqueous solvent.

10. The method of claim 9, wherein the electrophilic halogenation agent is an electrophilic chlorinating agent, an electrophilic fluorinating agent or an electrophilic brominating agent, and wherein the non-aqueous solvent is an ether, a ketone, a halocarbon, a heterocyclic, an alcohol or another polar organic solvent.

11. The method of claim 9, wherein said depositing the sacrificial metal layer on the metal surface prevents formation of at least one of the following: (a) an oxidative passivation layer on the ruthenium surface prior to etching the ruthenium layer with the halogen-based wet etch chemistry, and (b) ruthenium dioxide ($RuO_2$) and/or other ruthenium species having oxidation states higher than 3+ on the ruthenium surface while etching the ruthenium layer with the halogen-based wet etch chemistry.

12. A method for protecting a surface of a ruthenium (Ru) layer to be etched prior to etching the ruthenium layer in a wet atomic layer etching (ALE) process, the method comprising:
- depositing the ruthenium layer on a substrate, wherein a ruthenium surface of the ruthenium layer is exposed on a surface of the substrate;
- depositing a sacrificial metal layer on the ruthenium surface, wherein the sacrificial metal layer comprises a transition metal that differs from the ruthenium layer;
- performing the wet ALE process to remove the sacrificial metal layer from the ruthenium surface; and
- continuing the wet ALE process to etch the ruthenium layer once the sacrificial metal layer is removed from the ruthenium surface;
- wherein the wet ALE process exposes the substrate to a halogen-based wet etch chemistry that removes the sacrificial metal layer from the ruthenium surface and etches at least a portion of the ruthenium layer; and
- wherein the sacrificial metal layer increases an etch rate of the ruthenium layer during the wet ALE process, compared to an etch rate achieved without the sacrificial metal layer, by preventing formation of at least one of the following: (a) an oxidative passivation layer on the ruthenium surface prior to etching the ruthenium layer with the halogen-based wet etch chemistry, and (b) ruthenium dioxide ($RuO_2$) and/or other ruthenium species having oxidation states higher than 3+ on the ruthenium surface while etching the ruthenium layer with the halogen-based wet etch chemistry.

13. The method of claim 12, wherein the sacrificial metal layer is a copper (Cu) layer, a molybdenum (Mo) layer, a tungsten (W) layer, a nickel (Ni) layer, a cobalt (Co) layer, a platinum (Pt) layer, a gold (Au) layer, or an iridium (Ir) layer.

14. The method of claim 12, wherein the sacrificial metal layer is 1 nm to 5 nm thick.

15. The method of claim 12, wherein said depositing the sacrificial metal layer on the ruthenium surface is performed after said depositing the ruthenium layer on the substrate without exposing the substrate to air or other oxidizing environments to avoid forming an oxidative passivation layer on the ruthenium surface.

16. The method of claim 12, further comprising annealing the substrate in a reducing atmosphere to at least partially reduce the ruthenium surface prior to depositing the sacrificial metal layer on the ruthenium surface.

17. The method of claim 12, wherein said performing the wet ALE process to remove the sacrificial metal layer comprises:

exposing a transition metal surface of the sacrificial metal layer to a first etch solution comprising an electrophilic halogenation agent dissolved in a non-aqueous solvent to form a transition metal halide or oxyhalide passivation layer, which is self-limiting and insoluble in the non-aqueous solvent;

rinsing the substrate with a first purge solution to remove the first etch solution from the surface of the substrate;

exposing the transition metal halide or oxyhalide passivation layer to a second etch solution to selectively remove the transition metal halide or oxyhalide passivation layer and expose an unmodified transition metal surface underlying the transition metal halide or oxyhalide passivation layer;

rinsing the substrate with a second purge solution to remove the second etch solution from the surface of the substrate and etch the sacrificial metal layer; and repeating said exposing the transition metal surface of the sacrificial metal layer to the first etch solution, rinsing the substrate with the first purge solution, exposing the transition metal halide or oxyhalide passivation layer to the second etch solution, and rinsing the substrate with the second purge solution until the sacrificial metal layer is removed from the ruthenium surface.

18. The method of claim 17, wherein said continuing the wet ALE process to etch the ruthenium layer comprises:

exposing the ruthenium surface to the first etch solution comprising the electrophilic halogenation agent dissolved in the non-aqueous solvent to form a ruthenium halide or oxyhalide passivation layer, which is self-limiting and insoluble in the non-aqueous solvent;

rinsing the substrate with the first purge solution to remove the first etch solution from the surface of the substrate;

exposing the ruthenium halide or oxyhalide passivation layer to the second etch solution to selectively remove the ruthenium halide or oxyhalide passivation layer and expose an unmodified ruthenium surface underlying the ruthenium halide or oxyhalide passivation layer;

rinsing the substrate with the second purge solution to remove the second etch solution from the surface of the substrate and etch the ruthenium layer; and repeating said exposing the ruthenium surface to the first etch solution, rinsing the substrate with the first purge solution, exposing the ruthenium halide or oxyhalide passivation layer to the second etch solution, and rinsing the substrate with the second purge solution a number of times until a predetermined amount of the ruthenium layer is removed from the substrate.

19. The method of claim 18, wherein the electrophilic halogenation agent is an electrophilic chlorinating agent, an electrophilic fluorinating agent or an electrophilic brominating agent, and wherein the non-aqueous solvent is an ether, a ketone, a halocarbon, a heterocyclic, an alcohol or another polar organic solvent.

20. The method of claim 18, wherein the first etch solution comprises trichloroisocyanuric acid (TCCA) dissolved in a polar organic solvent, and wherein a concentration of the trichloroisocyanuric acid (TCCA) in the first etch solution ranges between 0.2% and 35%.

* * * * *